US012738232B2

(12) United States Patent
Luo et al.

(10) Patent No.: US 12,738,232 B2
(45) Date of Patent: Sep. 15, 2026

(54) SHIFT REGISTER, GATE DRIVING CIRCUIT AND DISPLAY APPARATUS

(71) Applicant: BOE Technology Group Co., Ltd., Beijing (CN)

(72) Inventors: Chengyuan Luo, Beijing (CN); Pan Xu, Beijing (CN); Ying Han, Beijing (CN); Donghui Zhao, Beijing (CN); Xing Zhang, Beijing (CN); Guangshuang Lv, Beijing (CN); Cheng Xu, Beijing (CN); Xing Yao, Beijing (CN); Dandan Zhou, Beijing (CN); Miao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 158 days.

(21) Appl. No.: 18/290,493

(22) PCT Filed: Feb. 28, 2023

(86) PCT No.: PCT/CN2023/078830

§ 371 (c)(1),
(2) Date: Jan. 28, 2025

(87) PCT Pub. No.: WO2024/178638

PCT Pub. Date: Sep. 6, 2024

(65) Prior Publication Data

US 2025/0166573 A1 May 22, 2025

(51) Int. Cl.

*G09G 3/3266* (2016.01)
*G09G 3/3233* (2016.01)
*G11C 19/28* (2006.01)

(52) U.S. Cl.

CPC ......... *G09G 3/3266* (2013.01); *G09G 3/3233* (2013.01); *G11C 19/28* (2013.01);

(Continued)

(58) Field of Classification Search

CPC ......... G09G 3/3266; G09G 2310/0286; G09G 3/3674; G09G 3/3677; G11C 19/28

See application file for complete search history.

(56) References Cited

U.S. PATENT DOCUMENTS

| | | | | |
|---|---|---|---|---|
| 2021/0158744 A1* | 5/2021 | Kang | ....................... | G09G 3/20 |
| 2021/0335203 A1* | 10/2021 | Feng | .................... | G09G 3/3266 |

(Continued)

FOREIGN PATENT DOCUMENTS

| | | |
|---|---|---|
| CN | 203882580 U | 10/2014 |
| CN | 106486049 A | 3/2017 |

(Continued)

OTHER PUBLICATIONS

Shift Register, Scanning Drive Circuit and Display Device (Year: 2021).*

*Primary Examiner* — Xuemei Zheng
(74) *Attorney, Agent, or Firm* — Nath, Goldberg & Meyer; Joshua B. Goldberg

(57) ABSTRACT

A shift register is provided to include: a voltage regulating circuit to adjust voltages at first and second nodes; a light-emitting cascade output circuit to write a second operating voltage to a light-emitting cascade signal output terminal in response to the voltage at the first node, and write a first operating voltage to the light-emitting cascade signal output terminal in response to the voltage at the second node; a light-emitting driving output circuit to write a third operating voltage to a light-emitting control driving signal output terminal in response to the voltage at the first node, and write a fifth operating voltage to the light-emitting control driving signal output terminal in response to the voltage at the second node; and a first anti-leakage circuit to write a fourth operating voltage to a first anti-leakage node in response to the voltage at the second node.

18 Claims, 25 Drawing Sheets

(52) U.S. Cl.
CPC ............... *G09G 2300/0426* (2013.01); *G09G 2310/0286* (2013.01); *G09G 2330/021* (2013.01)

(56) References Cited

U.S. PATENT DOCUMENTS

| | | | |
|---|---|---|---|
| 2022/0068212 | A1 | 3/2022 | Yao et al. |
| 2022/0284861 | A1 | 9/2022 | Yang et al. |

FOREIGN PATENT DOCUMENTS

| | | | | | |
|---|---|---|---|---|---|
| CN | 210956110 | U | | 7/2020 | |
| CN | 111489699 | A | | 8/2020 | |
| CN | 112634812 | A | | 4/2021 | |
| CN | 113192453 | A | | 7/2021 | |
| CN | 113793570 | A | * | 12/2021 | ........... G09G 3/3266 |
| CN | 113889022 | A | | 1/2022 | |
| CN | 113903309 | A | | 1/2022 | |
| CN | 113921070 | A | | 1/2022 | |
| CN | 114038418 | A | | 2/2022 | |
| CN | 114464133 | A | | 5/2022 | |
| CN | 115662486 | A | | 1/2023 | |
| CN | 120032595 | A | * | 5/2025 | ............... G09G 3/30 |
| KR | 20210075851 | A | | 6/2021 | |
| WO | 2021227590 | A1 | | 11/2021 | |

* cited by examiner

SHIFT REGISTER, GATE DRIVING CIRCUIT AND DISPLAY APPARATUS

This is a National Phase Application filed under 35 U.S.C. 371 as a national stage of PCT/CN2023/078830, filed Feb. 28, 2023, the content of each of which is hereby incorporated by reference in its entirety.

TECHNICAL FIELD

The present disclosure relates to the field of display technology, and in particular to a shift register, a gate driving circuit and a display apparatus.

BACKGROUND

An active matrix organic light-emitting diode panel (AMOLED) is used more and more widely. A pixel display device of the AMOLED is an organic light-emitting diode (OLED). A thin film transistor is driven to generate a driving current in a saturated state, and the driving current drives the organic light-emitting diode to emit light, so that the AMOLED can emit light.

SUMMARY

In a first aspect, embodiments of the present disclosure provide a shift register, including: a voltage regulating circuit electrically connected to a light-emitting signal input terminal, a first clock signal terminal, a second clock signal terminal, a first node, and a second node, and configured to adjust voltages at the first node and the second node in response to control of signals provided by the light-emitting signal input terminal, the first clock signal terminal, and the second clock signal terminal; a light-emitting cascade output circuit electrically connected to a first power terminal, a second power terminal, a light-emitting cascade signal output terminal, the first node, and the second node, and configured to write a second operating voltage provided by the second power terminal to the light-emitting cascade signal output terminal in response to control of the voltage at the first node, and write a first operating voltage provided by the first power terminal to the light-emitting cascade signal output terminal in response to control of the voltage at the second node; a light-emitting driving output circuit electrically connected to a fifth power terminal, a third power terminal, a light-emitting control driving signal output terminal, the second node, the first node, and configured to write a third operating voltage provided by the third power terminal to the light-emitting control driving signal output terminal in response to control of the voltage at the first node, and to write a fifth operating voltage provided by the fifth power terminal to the light-emitting control driving signal output terminal in response to control of the voltage at the second node; and a first anti-leakage circuit electrically connected to the light-emitting cascade output circuit at the first anti-leakage node, and further electrically connected to the first node, the second node, the second power terminal, and a fourth power terminal, and configured to write a fourth operating voltage provided by the fourth power terminal to the first anti-leakage node in response to control of the voltage at the second node.

In some embodiments, the first anti-leakage circuit includes a thirteenth transistor and a fourteenth transistor, a control electrode of the thirteenth transistor is electrically connected to the first node, a first electrode of the thirteenth transistor is electrically connected to the second power terminal, and a second electrode of the thirteenth transistor is electrically connected to the first anti-leakage node and a second electrode of the fourteenth transistor; and a control electrode of the fourteenth transistor is electrically connected to the second node, and a first electrode of the fourteenth transistor is electrically connected to the fourth power terminal.

In some embodiments, the shift register further includes a second anti-leakage circuit, the voltage regulating circuit is electrically connected to a fourth node, and the second anti-leakage circuit is between the fourth node and the second node; and the second anti-leakage circuit is further electrically connected to the first power terminal and the fourth power terminal, and is configured to write the fourth operating voltage provided by the fourth power terminal to the second anti-leakage node under control of the voltage at the second node, where the second anti-leakage node is between the second node and the fourth node.

In some embodiments, the second anti-leakage circuit includes a third transistor, a fourth transistor, and a fifth transistor; a control electrode of the third transistor is electrically connected to the first power terminal, a first electrode of the third transistor is electrically connected to the fourth node, and a second electrode of the third transistor is electrically connected to the second anti-leakage node; a control electrode of the fourth transistor is electrically connected to the first power terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node.

In some embodiments, the shift register further includes a second anti-leakage circuit, the voltage regulating circuit is electrically connected to a fourth node, and the second anti-leakage circuit is between the fourth node and the second node; and the second anti-leakage circuit is further electrically connected to the first clock signal terminal and the fourth power terminal, and is configured to write the fourth operating voltage provided by the fourth power terminal to the fourth node under control of the voltage at the second node.

In some embodiments, the second anti-leakage circuit includes a fourth transistor and a fifth transistor; a control electrode of the fourth transistor is electrically connected to the first clock signal terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node.

In some embodiments, the second anti-leakage circuit includes a third transistor, a fourth transistor, and a fifth transistor; a control electrode of the third transistor is electrically connected to the first clock signal terminal, a first electrode of the third transistor is electrically connected to the fourth node, and a second electrode of the third transistor is electrically connected to the second anti-leakage node; a control electrode of the fourth transistor is electrically connected to the first clock signal terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node.

In some embodiments, the light-emitting cascade output circuit includes a seventh transistor and a twelfth transistor, a control electrode of the twelfth transistor is electrically connected to the first node, a first electrode of the twelfth transistor is electrically connected to the first anti-leakage node, and a second electrode of the twelfth transistor is electrically connected to the light-emitting cascade signal output terminal; and a control electrode of the seventh transistor is electrically connected to the second node, a first electrode of the seventh transistor is electrically connected to the light-emitting cascade signal output terminal, and a second electrode of the seventh transistor is electrically connected to the first power terminal.

In some embodiments, the light-emitting cascade output circuit further includes a fourth capacitor, and a first terminal of the fourth capacitor is electrically connected to the light-emitting cascade signal output terminal, and a second terminal of the fourth capacitor is electrically connected to the second node.

In some embodiments, the voltage regulating circuit includes: a light-emitting global reset circuit electrically connected to a light-emitting global reset signal terminal, the first power terminal, and the fourth node, and configured to write the first operating voltage provided by the first power terminal to the fourth node in response to control of a signal provided by the light-emitting global reset signal terminal.

In some embodiments, the light-emitting global reset circuit includes a first transistor; and a control electrode of the first transistor is electrically connected to the light-emitting global reset signal terminal, a first electrode of the first transistor is electrically connected to the fourth node, and a second electrode of the first transistor is electrically connected to the first power terminal.

In some embodiments, the voltage regulating circuit includes: a light-emitting global reset circuit electrically connected to a light-emitting global reset signal terminal, the first power terminal, and the second node, and configured to write the first operating voltage provided by the first power terminal to the second node in response to control of a signal provided by the light-emitting global reset signal terminal.

In some embodiments, the light-emitting global reset circuit includes a first transistor; and a control electrode of the first transistor is electrically connected to the light-emitting global reset signal terminal, a first electrode of the first transistor is electrically connected to the second node, and a second electrode of the first transistor is electrically connected to the first power terminal.

In some embodiments, the voltage regulating circuit includes: a first input circuit electrically connected to the light-emitting signal input terminal, the first clock signal terminal, and the fourth node, and configured to write a signal provided by the light-emitting signal input terminal to the fourth node in response to control of a signal provided by the first clock signal terminal; a second input circuit electrically connected to the light-emitting signal input terminal, the second clock signal terminal, the first power terminal, and a third node, and configured to write a first operating voltage provided by the first power terminal to the third node in response to control of a signal provided by the second clock signal terminal, and write a signal provided by the second clock signal terminal to the third node in response to control of a signal provided by the light-emitting signal input terminal; a first voltage control circuit electrically connected to the first clock signal terminal, the second power terminal, the first node, the second node, and the third node, and configured to write a signal provided by the first clock signal terminal to the first node in response to control of a voltage at the third node and a signal provided by the first clock signal terminal, and write the second operating voltage provided by the second power terminal to the first node in response to control of a voltage at the second node; and a second voltage control circuit electrically connected to the first clock signal terminal, the third power terminal, the third node, and the fourth node, and configured to write the second operating voltage provided by the third power terminal to the fourth node in response to the voltage at the third node and a signal provided by the second clock signal terminal.

In some embodiments, the first input circuit includes a second transistor; the second input circuit includes an eighth transistor and a fifteenth transistor; the first voltage control circuit includes a ninth transistor, a tenth transistor, an eighteenth transistor and a third capacitor; the second voltage control circuit includes a sixteenth transistor and a seventeenth transistor; a control electrode of the second transistor is electrically connected to the first clock signal terminal, a first electrode of the second transistor is electrically connected to the light-emitting signal input terminal, and a second electrode of the second transistor is electrically connected to the fourth node; a control electrode of the eighth transistor is electrically connected to the second clock signal terminal, a first electrode of the eighth transistor is electrically connected to the first power terminal, and a second electrode of the eighth transistor is electrically connected to the third node; a control electrode of the fifteenth transistor is electrically connected to the light-emitting signal input terminal, a first electrode of the fifteenth transistor is electrically connected to the third node, and a second electrode of the fifteenth transistor is electrically connected to the second clock signal terminal; a control electrode of the ninth transistor is electrically connected to the third node, a first electrode of the ninth transistor is electrically connected to the first clock signal terminal, and a second electrode of the ninth transistor is electrically connected to a second terminal of the third capacitor; a control electrode of the tenth transistor is electrically connected to the first clock signal terminal, a first electrode of the tenth transistor is electrically connected to the second terminal of the third capacitor, and a second electrode of the tenth transistor is electrically connected to the first node; a control electrode of the eighteenth transistor is electrically connected to the second node, a first electrode of the eighteenth transistor is electrically connected to the first node, and a second electrode of the eighteenth transistor is electrically connected to a second power terminal; a first terminal of the third capacitor is electrically connected to the third node; a control electrode of the seventeenth transistor is electrically connected to the third node, a first electrode of the seventeenth transistor is electrically connected to the third power terminal, and a second electrode of the seventeenth transistor is electrically connected to a first electrode of the sixteenth transistor; and a control electrode of the sixteenth transistor is electrically connected to the first clock signal terminal, and a second electrode of the sixteenth transistor is electrically connected to the fourth node.

In some embodiments, the light-emitting driving output circuit includes an eleventh transistor, a second capacitor, a first capacitor, and a sixth transistor; a control electrode of the eleventh transistor is electrically connected to the first node, a first electrode of the eleventh transistor is electrically connected to the third power terminal, and a second electrode of the eleventh transistor is electrically connected to the light-emitting control driving signal output terminal; a first terminal of the second capacitor is electrically connected to the third power terminal, and a second terminal of the second capacitor is electrically connected to the first node; a control electrode of the sixth transistor is electrically connected to the second node, a first electrode of the sixth transistor is electrically connected to the light-emitting control driving signal output terminal, and a second electrode of the sixth transistor is electrically connected to the fifth power terminal; and a first terminal of the first capacitor is electrically connected to the light-emitting control driving signal output terminal, and a second terminal of the first capacitor is electrically connected to the second node.

In some embodiments, the fourth operating voltage provided by the fourth power terminal is higher than the first operating voltage provided by the first power terminal.

In some embodiments, the second operating voltage provided by the second power terminal is lower than the third operating voltage provided by the third power terminal.

Embodiments of the present disclosure further provide a gate driving circuit, including: a plurality of cascaded first shift registers, each of which adopts the shift register in the above embodiments; a light-emitting signal input terminal of the first shift register at the first stage is electrically connected to a light-emitting start signal line, and the first shift registers at the stages other than the first stage are electrically connected to light-emitting cascade signal output terminals of the first shift registers at the respective previous stages; and the light-emitting control driving signal output terminals of the first shift registers are electrically connected to corresponding light-emitting control signal lines.

Embodiments of the present disclosure further provide a display apparatus, including: a display region and a peripheral region at a periphery of the display region; wherein the display region includes a plurality of pixel units in an array therein, each row of pixel units is configured with a corresponding light-emitting control signal line electrically connected to a control electrode of an light-emitting control transistor in the corresponding pixel unit; and the peripheral region includes a first gate driving circuit, which employs the gate driving circuit in the above embodiments.

In some embodiments, the light-emitting driving output circuit, the light-emitting cascade output circuit, and the voltage regulating circuit of the first shift register in the first gate driving circuit are sequentially distributed in a direction away from the display region; and the first anti-leakage circuit of the first shift register is in a region between the light-emitting driving output circuit and the voltage regulating circuit.

In some embodiments, the first power terminal is electrically connected to a first power signal line; the second power terminal is electrically connected to a second power signal line; the third power terminal is electrically connected to a third power signal line; the fourth power terminal is electrically connected to a fourth power signal line; the first clock signal terminal is electrically connected to a first clock signal line; the second clock signal terminal is electrically connected to a second clock signal line; the light-emitting signal input terminal is electrically connected to a light-emitting signal input line; the light-emitting global reset signal terminal is electrically connected to a light-emitting global reset signal line; the first clock signal line, the second clock signal line, the light-emitting signal input line, the light-emitting global reset signal line, the first power signal line and the fourth power signal line are on a side of the voltage regulating circuit away from the display region and are distributed sequentially in a direction close to the display region; and the third power signal line and the second power signal line are on a side of the light-emitting driving output circuit close to the display region and are sequentially distributed in a direction close to the display region.

In some embodiments, the first anti-leakage node of the first shift register in the first gate driving circuit is in the same layer as the first electrode of the twelfth transistor, the second electrode of the thirteenth transistor, and the second electrode of the fourteenth transistor, the first electrode of the twelfth transistor and the second electrode of the thirteenth transistor extend along a direction away from the display region to the second electrode of the fourteenth transistor, so that the first anti-leakage node is electrically connected to the second electrode of the fourteenth transistor; the first electrode and the second electrode of the twelfth transistor, the first electrode and the second electrode of the thirteenth transistor, and the first electrode and the second electrode of the fourteenth transistor are in the same layer; and the control electrodes, active layers and the first electrodes of the twelfth transistor, the thirteenth transistor and the fourteenth transistor are sequentially on a substrate.

In some embodiments, the second anti-leakage node of the first shift register in the first gate driving circuit is in the same layer as the first electrode of the fourth transistor and the second electrode of the fifth transistor, the first electrode and the second electrode of the fourth transistor and the first electrode and the second electrode of the fifth transistor are in the same layer; and the control electrodes, active layers and the first electrodes of the fourth transistor and the fifth transistor are sequentially on a substrate.

In some embodiments, the second anti-leakage node of the first shift register in the first gate driving circuit is in the same layer as the second electrode of the third transistor, the first electrode of the fourth transistor, and the second electrode of the fifth transistor, the first electrode and the second electrode of the third transistor, the first electrode and the second electrode of the fourth transistor, and the first electrode and the second electrode of the fifth transistor are in the same layer; and the control electrodes, active layers and the first electrodes of the third transistor, the fourth transistor and the fifth transistor are sequentially on a substrate.

In some embodiments, a first plate of the first capacitor, the control electrode of the sixth transistor, a first plate of the fourth capacitor, the control electrode of the seventh transistor, the control electrode of the fourteenth transistor, and the control electrode of the fifth transistor in the first shift register are in the same layer, and are electrically connected to each other as a whole, and extend along a direction away from the display region.

In some embodiments, the light-emitting cascade signal output terminal in the first shift register is in a region between the fourth power signal line and the light-emitting cascade output circuit; the light-emitting control driving signal output terminal in the first shift register is in a region between the light-emitting driving output circuit and the third power signal line; and the light-emitting cascade signal output terminal and the light-emitting control driving signal output terminal are in the same layer as the first electrodes and the second electrodes of the transistors in the first shift register.

In some embodiments, the light-emitting cascade signal output terminal of the first shift register at the previous stage and the light-emitting signal input terminal of the first shift register at the next stage are electrically connected to each other by a first connection line; and the first connection line is in the same layer as the control electrodes of the transistors.

In some embodiments, the first clock signal line, the second clock signal line, the light-emitting signal input line, the light-emitting global reset signal line, the first power signal line, the fourth power signal line, the third power signal line, and the second power signal line are parallel to each other and extend in the arrangement direction of the plurality of first shift registers; and the first connection line extends in the arrangement direction of the plurality of first shift registers.

DETAIL DESCRIPTION OF EMBODIMENTS

Figure 1:
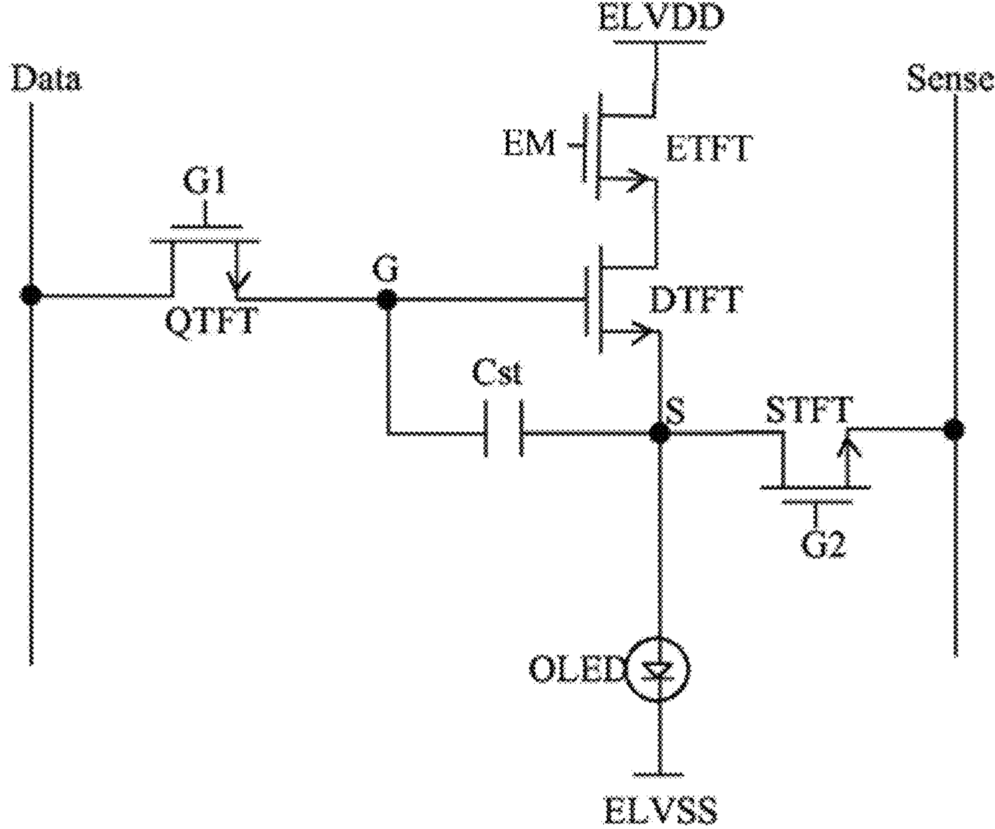
FIG. 1 is a schematic diagram of a circuit structure of a pixel unit in a display substrate in the related art.

In order to enable one of ordinary skill in the art to better understand the technical solutions of the present disclosure, a shift register, a gate driving circuit and a display apparatus provided by the present disclosure will be described in further detail with reference to the accompanying drawings.

The terms "first", "second", and the like used in embodiments of the present disclosure are not intended to indicate any order, quantity, or importance, but rather are used for distinguishing one element from another. Similarly, the term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections.

Transistors used in the embodiments of the present disclosure may be thin film transistors or field effect transistors or other devices having the same characteristics. In the embodiments, a drain electrode and a source electrode of each transistor may be interchangeable, and actually, there is no difference between the drain electrode and the source electrode of each transistor in the embodiments of the present disclosure. Here, only in order to distinguish two electrodes of the transistor except for a control electrode (i.e., a gate electrode), one of the two electrodes is referred to as a drain electrode, and the other electrode is referred to as a source electrode. The thin film transistor used in the embodiments of the present disclosure may be an N-type transistor or a P-type transistor. In the embodiments of the present disclosure, when the N-type thin film transistor is used, a first electrode thereof may be a source electrode, and a second electrode thereof may be a drain electrode. In the following embodiments, as an example, the thin film transistor is the N-type transistor for description.

In the present disclosure, an "active level signal" refers to a signal input to the control electrode of the transistor to control the transistor to be turned on, and a "non-active level signal" refers to a signal input to the control electrode of the transistor to control the transistor to be turned off. For an N-type transistor, a high level signal is an active level signal, and a low level signal is a non-active level signal; for a P-type transistor, a low level signal is an active level signal and a high level signal is a non-active level signal.

In the following description, as an example, the transistor is the N-type transistor for description. At this time, an active level signal refers to a high level signal and a non-active level signal refers to a low level signal. It is conceivable that when a P-type transistor is employed, the timing of the control signal needs to be adjusted accordingly. Specific details are not set forth herein but are to be understood as being within the scope of the present disclosure.

Figure 2:
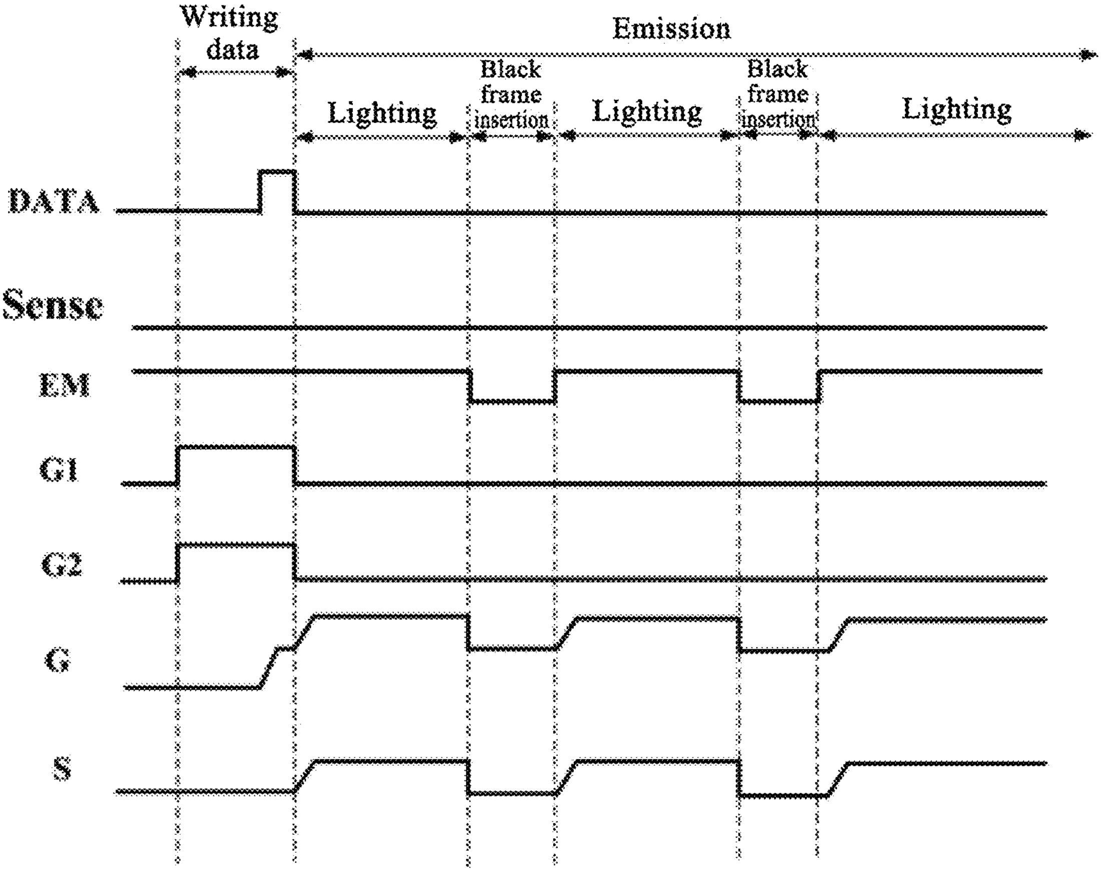
FIG. 2 is a timing diagram illustrating an operation of the pixel unit shown in FIG. 1.

FIG. 1 is a schematic diagram of a circuit structure of a pixel unit in a display substrate in the related art. FIG. 2 is a timing diagram illustrating an operation of the pixel unit shown in FIG. 1. As shown in FIG. 1 to FIG. 2, the pixel unit in the related art has a 4T1C structure, and includes a data writing transistor QTFT, a driving transistor DTFT, a sensing transistor STFT, a light-emitting control transistor ETFT, and one capacitor (one storage capacitor Cst). A control electrode of the data writing transistor QTFT is electrically connected to a first gate line G1; a first electrode of the data writing transistor QTFT is electrically connected to a data line DATA; a control electrode of the sensing transistor STFT is electrically connected to a second gate line G2; and a first electrode of the sensing transistor STFT is electrically connected to a sensing line SENCE. The light-emitting control transistor ETFT is disposed between the driving transistor DTFT and a power terminal ELVDD, and a control electrode of the light-emitting control transistor ETFT is connected to a light-emitting control signal line EM. As still another example, the light-emitting control transistor may be disposed between the driving transistor DTFT and a light-emitting element OLED (no corresponding drawing is given).

Each pixel unit necessarily goes through a display data writing phase and a light-emitting phase in one frame; in the display data writing phase, the first gate line G1 controls the data writing transistor QTFT to be turned on, and the data line Data writes a data voltage Vdata into the control electrode of the driving transistor DTFT; in the light-emitting phase, the driving transistor DTFT outputs a corresponding driving current according to a voltage at the control electrode of the driving transistor DTFT, so as to drive the light-emitting element OLED to emit light.

Referring to FIG. 2, for each pixel unit, the light-emitting control transistor ETFT is controlled to be turned on or off by the light-emitting control signal line in the light-emitting phase, so that the lighting time of the light-emitting element OLED in the light-emitting phase can be controlled, and the equivalent brightness (i.e. the brightness sensed by the human eye, also referred to as the sensory brightness) of the light-emitting element OLED in one frame can be controlled. Specifically, the light-emitting phase includes a lighting phase and a black frame insertion phase, and the light-emitting control signal includes a light-emitting driving signal and a black frame insertion driving signal; in the lighting phase, a light-emitting driving signal (namely, an active level signal) is provided through the light-emitting control signal line to control the light-emitting control transistor ETFT to be turned on. At the time, the driving transistor may normally output a driving current, and the light-emitting element OLED emits light. In the black frame insertion phase, the light-emitting control transistor ETFT is controlled to be turned off by providing the black frame insertion driving signal (i.e., a non-active level signal) through the light-emitting control signal line. At this time, the driving transistor DTFT outputs no driving current, and the light-emitting element does not emit light. In general, the longer the total duration of the black frame insertion phase is, the lower the equivalent brightness of the light-emitting element is.

In a shift register in the related art, a shift register in the light-emitting control gate driving circuit is referred to as a first shift register, which may be used to provide light-emitting control signals (including the light-emitting driving signal and the black frame insertion driving signal) to the corresponding light-emitting control signal line EM.

Figure 3:
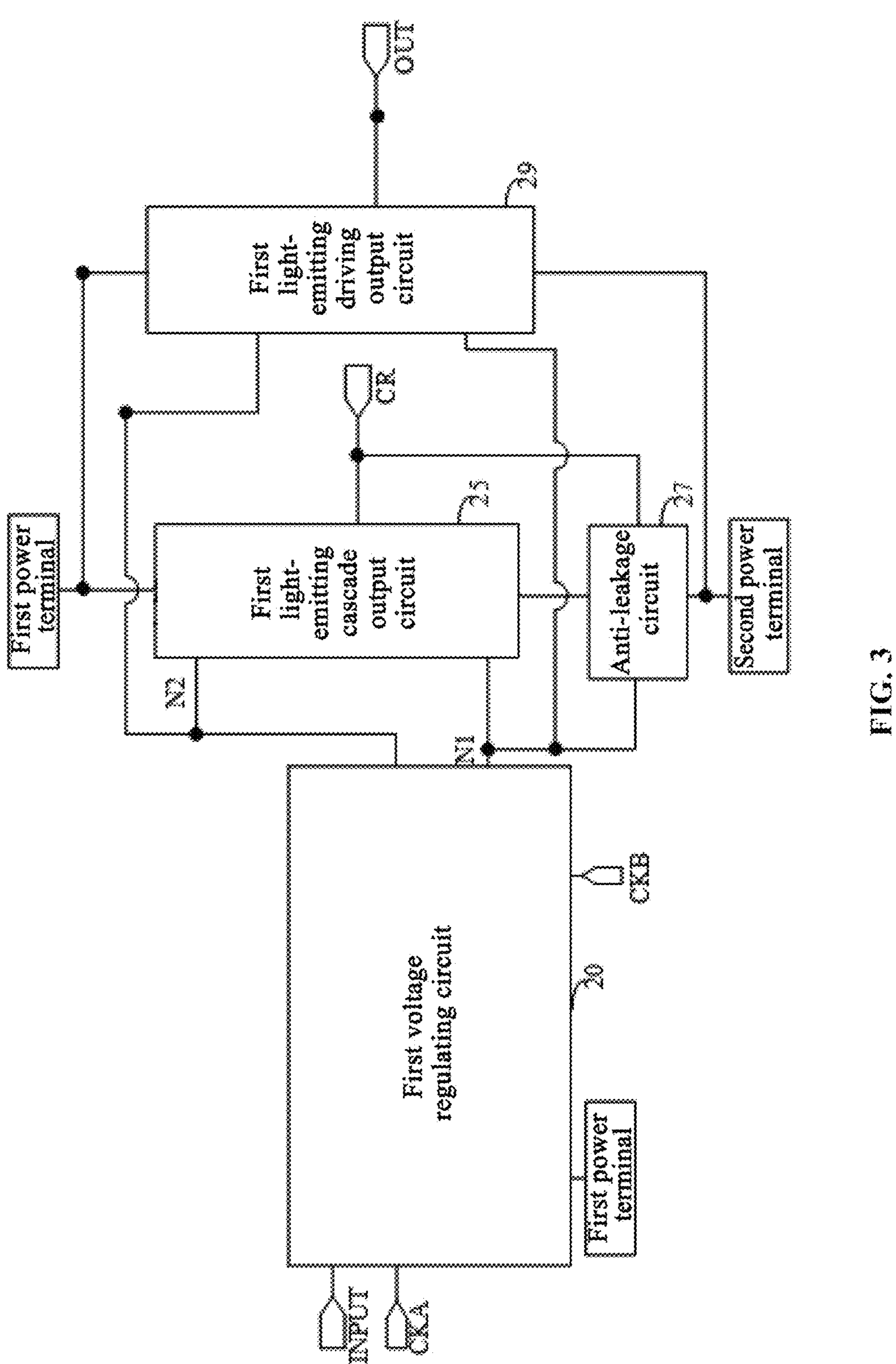
FIG. 3 is a schematic diagram of a circuit structure of a first shift register in the related art.
Figure 4:
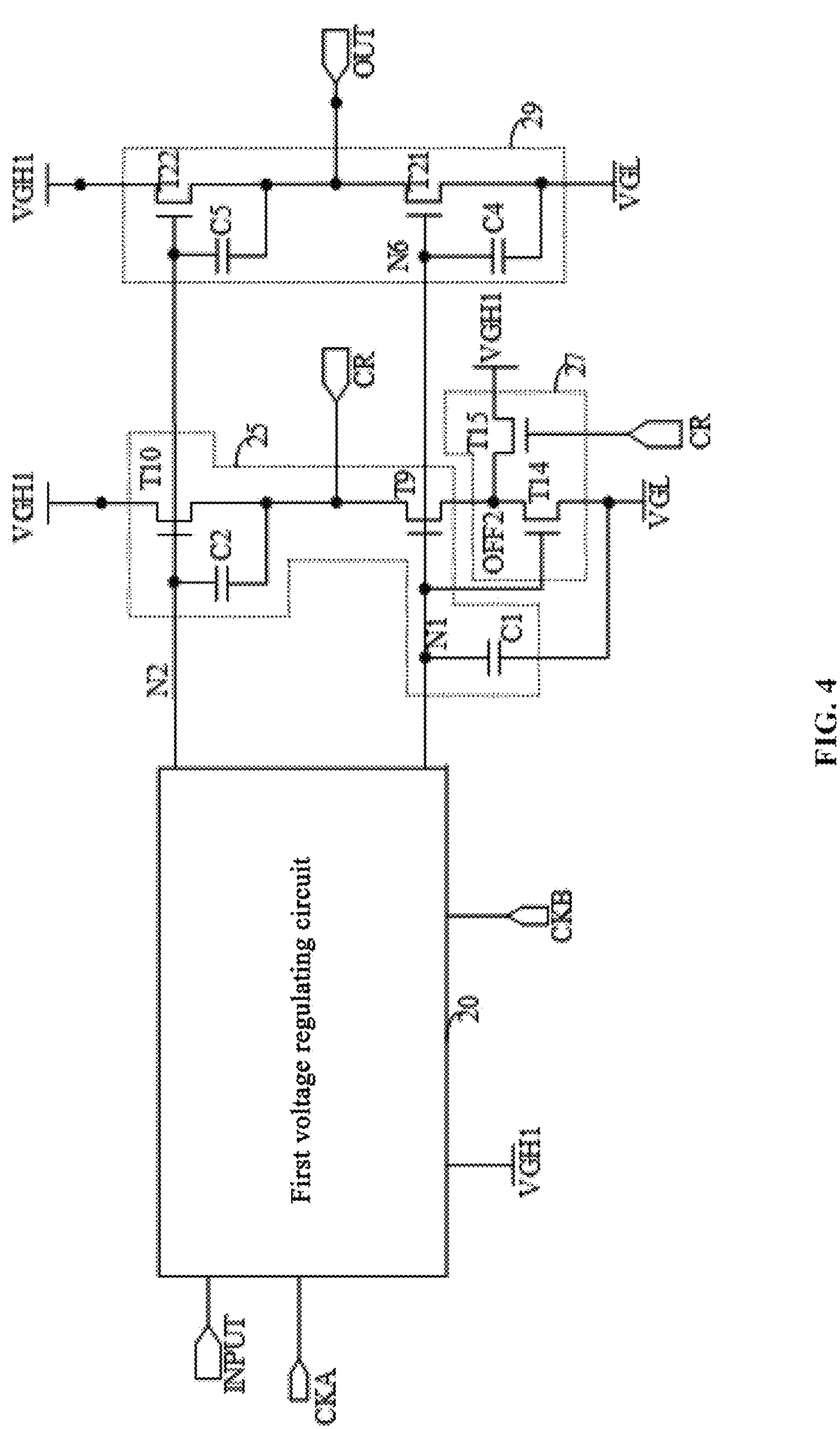
FIG. 4 is a schematic diagram of another circuit structure of a first shift register in the related art.

FIG. 3 is a schematic diagram of a circuit structure of a first shift register in the related art. FIG. 4 is a schematic diagram of another circuit structure of a first shift register in the related art. As shown in FIGS. 3 and 4, the first shift register includes: a first voltage regulating circuit 20, a first light-emitting cascade output circuit 25 and a first light-emitting driving output circuit 29.

The first voltage regulating circuit 20 is electrically connected to a light-emitting signal input terminal INPUT, a first clock signal terminal CKA, a second clock signal terminal CKB, a first power terminal, a first node N1, and a second node N2, and is configured to adjust voltages at the first node N1 and the second node N2 in response to control of signals provided by the light-emitting signal input terminal INPUT, the first clock signal terminal CKA, and the second clock signal terminal CKB.

The first light-emitting cascade output circuit 25 is electrically connected to the first power terminal, the second power terminal, the light-emitting cascade signal output terminal CR, the first node N1, and the second node N2, and is configured to write a second operating voltage provided from the second power terminal to the light-emitting cascade signal output terminal CR in response to control of the voltage at the first node N1, and to write a first operating voltage provided from the first power terminal to the light-emitting cascade signal output terminal CR in response to control of the voltage at the second node N2.

The first light-emitting driving output circuit 29 is electrically connected to the first power terminal, the second power source, the light-emitting control driving signal output terminal OUT, the second node N2, and a sixth node N6, and is configured to write the second operating voltage provided from the second power terminal to the light-emitting control driving signal output terminal OUT in response to control of the voltage at the sixth node N6, and to write the first operating voltage provided from the first power terminal to the light-emitting control driving signal output terminal OUT in response to control of the voltage at the second node N2; the sixth node N6 is electrically connected to the first node N1.

In the related art, the light-emitting cascade signal output terminal CR and the light-emitting control driving signal output terminal OUT of the first shift register are separately provided, wherein the first light-emitting cascade output circuit 25 is configured to control the output of the light-emitting cascade signal output terminal CR, and the first light-emitting driving output circuit 29 is configured to control the output of the light-emitting control driving signal output terminal OUT; that is, the light-emitting cascade signal and the light-emitting control signal output by the first shift register may be controlled separately. Therefore, in the related art, the light-emitting control signals output by the first shift registers can be independently controlled under the condition that the normal cascade connection of the first shift registers in the light-emitting control gate driving circuit is ensured.

In some embodiments, referring to FIGS. 3 and 4, the first shift register further includes an anti-leakage circuit 27; the first light-emitting cascade output circuit 25 is electrically connected to the second power terminal through the anti-leakage circuit 27, and the first light-emitting cascade output circuit 25 and the anti-leakage circuit 27 are electrically connected to a first anti-leakage node OFF2; the anti-leakage circuit 27 is further electrically connected to the first node N1, the first power terminal, and the second power terminal, is further electrically connected to the light-emitting cascade signal output terminal CR, and is configured to write the first operating voltage provided from the first power terminal into the first anti-leakage node OFF2 in response to control of a voltage at the light-emitting cascade signal output terminal CR.

Referring to FIG. 4, in some embodiments, the first light-emitting cascade output circuit 25 includes a ninth transistor T9 and a tenth transistor T10, and the first light-emitting driving output circuit 29 includes a twenty-first transistor T21 and a twenty-second transistor T22.

A control electrode of the ninth transistor T9 is electrically connected to the first node N1, a first electrode of the ninth transistor T9 is electrically connected to the second power terminal, and a second electrode of the ninth transistor T9 is electrically connected to the light-emitting cascade signal output terminal.

A control electrode of the tenth transistor T10 is electrically connected to the second node N2, a first electrode of the tenth transistor T10 is electrically connected to the light-emitting cascade signal output terminal, and a second electrode of the tenth transistor T10 is electrically connected to the first power terminal.

A control electrode of the twenty-first transistor T21 is electrically connected to the sixth node N6, a first electrode of the twenty-first transistor T21 is electrically connected to the second power terminal, and a second electrode of the twenty-first transistor T21 is electrically connected to the light-emitting control driving signal output terminal OUT.

A control electrode of the twenty-second transistor T22 is electrically connected to the second node, a first electrode of the twenty-second transistor T22 is electrically connected to the light-emitting control driving signal output terminal OUT, and a second electrode of the twenty-second transistor T22 is electrically connected to the first power terminal.

In some embodiments, the first light-emitting cascade output circuit 25 further includes a first capacitor C1 and a second capacitor C2. A first terminal of the first capacitor C1 is electrically connected to the first node N1, and a second terminal of the first capacitor C1 is electrically connected to the second power terminal. A first terminal of the second capacitor C2 is electrically connected to the light-emitting cascade signal output terminal, and a second terminal of the second capacitor C2 is electrically connected to the second node N2. The first capacitor C1 and the second capacitor C2 are provided to improve the stability of the voltages at the first node and the second node.

In some embodiments, the first light-emitting driving output circuit 29 further includes a fourth capacitor C4 and a fifth capacitor C5. A first terminal of the fourth capacitor C4 is electrically connected to the sixth node N6, and a second terminal of the fourth capacitor C4 is electrically connected to the second power terminal. A first terminal of the fifth capacitor C5 is electrically connected to the light-emitting control driving signal output terminal, and a second terminal of the fifth capacitor C5 is electrically connected to the second node N2.

In some embodiments, the anti-leakage circuit 27 includes a fourteenth transistor T14 and a fifteenth transistor T15.

A control electrode of the fourteenth transistor T14 is electrically connected to the first node N1, a first electrode of the fourteenth transistor T14 is electrically connected to the second power terminal, and a second electrode of the fourteenth transistor T14 is electrically connected to the first anti-leakage node OFF2.

A control electrode of the fifteenth transistor T15 is electrically connected to the light-emitting cascade signal output terminal CR, a first electrode of the fifteenth transistor T15 is electrically connected to the first power terminal, and a second electrode of the fifteenth transistor T15 is electrically connected to the first anti-leakage node OFF2.

Figure 5:
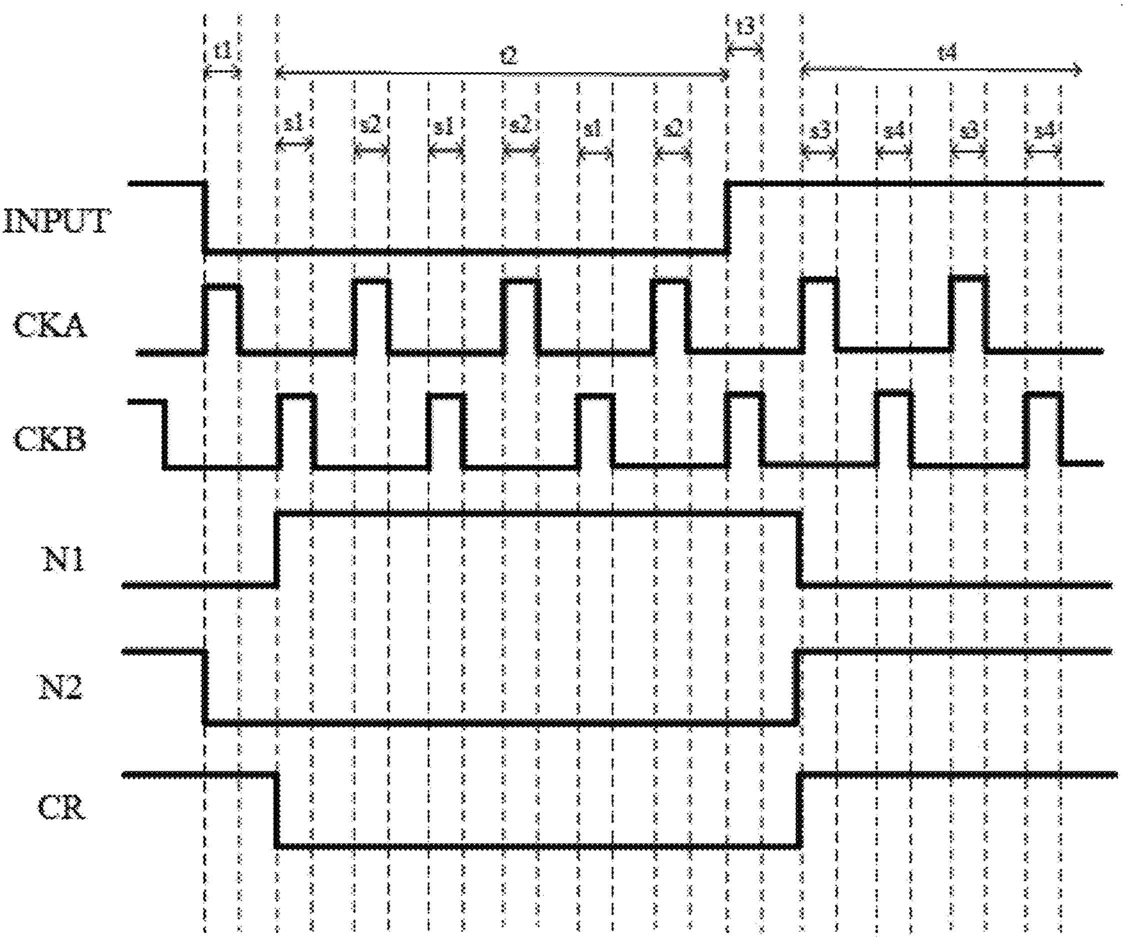
FIG. 5 is a timing diagram illustrating an operation of the first shift register shown in FIG. 4.

FIG. 5 is a timing diagram illustrating an operation of the first shift register shown in FIG. 4. As shown in FIG. 5, the first operating voltage provided by the first power terminal is a high level operating voltage VGH1, and the second operating voltage provided by the second power terminal is a low level operating voltage VGL. The process of the first shift register outputting the light-emitting cascade signal through the light-emitting cascade signal output terminal is described in detail below. The process of outputting the light-emitting cascade signal by the first shift register shown in FIG. 4 includes the following operation phases:

In a first phase t1, the light-emitting signal input terminal INPUT provides a low level signal, the first clock signal terminal CKA provides a high level signal, and the second clock signal terminal CKB provides a low level signal. The fifteenth transistor T15 is turned on; the ninth transistor T9, the tenth transistor T10, and the fourteenth transistor T14 are all turned off. Since the ninth transistor T9 and the tenth transistor T10 are both turned off, the light-emitting cascade signal output terminal is in a floating state, and the light-emitting cascade signal output terminal maintains a high level state in a previous phase, i.e., the light-emitting cascade signal output terminal CR outputs a high level signal.

A second phase t2 includes two sub-phases s1 and s2, which are performed alternately.

In the sub-phase s1, the light-emitting signal input terminal INPUT provides a low level signal, the first clock signal terminal CKA provides a low level signal, and the second clock signal terminal CKB provides a high level signal. The ninth transistor T9 and the fourteenth transistor T14 are both turned on; the tenth transistor T10 and the fifteenth transistor T15 are both turned off. The voltage at the first node N1 is in a high level state, and at this time, the ninth transistor T9 and the fourteenth transistor T14 are both turned on, the second operating voltage VGL is written into the light-emitting cascade signal output terminal CR through the fourteenth transistor T14 and the ninth transistor T9, and the light-emitting cascade signal output terminal CR outputs a low level signal. Accordingly, the fifteenth transistor T15 is turned off.

In the sub-phase s2, the light-emitting signal input terminal INPUT provides a low level signal, the first clock signal terminal CKA provides a high level signal, and the second clock signal terminal CKB provides a low level signal. The ninth transistor T9 and the fourteenth transistor T14 are both turned on; the tenth transistor T10 and the fifteenth transistor T15 are both turned off. The first node N1 maintains the high level state in the previous node, the ninth transistor T9 and the fourteenth transistor T14 maintain turned on, and the light-emitting cascade signal output terminal CR maintains outputting a low level signal. Accordingly, the fifteenth transistor T15 maintains turned off.

In a third phase t3, the light-emitting signal input terminal INPUT provides a high level signal, the first clock signal terminal CKA provides a low level signal, and the second clock signal terminal CKB provides a high level signal. The light-emitting cascade signal output terminal CR maintains outputting a low level signal. The ninth transistor T9 and the fourteenth transistor T14 are both turned on; the tenth transistor T10 and the fifteenth transistor T15 are both turned off. The specific operation process of the first shift register in the third phase t3 is the same as that in the sub-phase s1, and is not described herein again.

A fourth phase t4 includes two sub-phases s3, s4 which are alternately performed.

In the sub-phase s3, the light-emitting signal input terminal INPUT provides a high level signal, the first clock signal terminal CKA provides a high level signal, and the second clock signal terminal CKB provides a low level signal. The tenth transistor T10 and the fifteenth transistor T15 are both turned on, and the ninth transistor T9 and the fourteenth transistor T14 are both turned off. The voltage at the first node N1 is in a low level state. At this time, both the ninth transistor T9 and the fourteenth transistor T14 are turned off. In the case where the ninth transistor T9 is turned off and the tenth transistor T10 is turned on, the light-emitting cascade signal output terminal CR outputs a high level signal. Accordingly, the fifteenth transistor T15 is turned on.

In the sub-phase s4, the light-emitting signal input terminal INPUT provides a high level signal, the first clock signal terminal CKA provides a low level signal, and the second clock signal terminal CKB provides a high level signal. The tenth transistor T10 and the fifteenth transistor T15 are both turned on, and the ninth transistor T9 and the fourteenth transistor T14 are both turned off. The second node N2 is floating to maintain the high level state in the previous phase, and at this time, the tenth transistor T10 is turned on, the voltage at the first node N1 is maintained at a low level state, and both the ninth transistor T9 and the fourteenth transistor T14 maintains turned off. In a case where the ninth transistor T9 is turned off and the tenth transistor T10 is turned on, the light-emitting cascade signal output terminal CR maintains outputting a high level signal. Accordingly, the fifteenth transistor T15 is turned on.

Subsequently, when the first clock signal terminal CKA provides a high level signal and the light-emitting signal input terminal INPUT provides a low level signal, the first phase t1 of the next cycle is entered.

As can be seen from the operation timing of the first shift register, the light-emitting cascade signal output terminal CR is active when the light-emitting cascade signal output by the light-emitting cascade signal output terminal CR is a low level signal (i.e. the light-emitting cascade signal is a low level signal), most of the time, the light-emitting cascade signal output terminal CR outputs a high level signal, i.e. the ninth transistor T9, the tenth transistor T10, and the fourteenth transistor T14 are turned on for a long time, a threshold voltage is easily drift negatively, so that the ninth transistor T9, the tenth transistor T10, and the fourteenth transistor T14 cannot be turned off; since there are a large voltage drop and a large current in a path from the first power terminal to the second power terminal through the ninth transistor T9, the tenth transistor T10, and the fourteenth transistor T14, the high level signal output by the light-emitting cascade signal output terminal CR is easily pulled down, so that the light-emitting cascade signal output terminal CR erroneously outputs a low level signal, that is, the light-emitting cascade signal output terminal CR erroneously outputs a light-emitting cascade signal; and the control electrode of the fifteenth transistor T15 in the first shift register is electrically connected to the light-emitting cascade signal output terminal CR, when the light-emitting cascade signal output terminal CR erroneously outputs a low level signal, the fifteenth transistor T15 cannot be turned on, which in turn causes the first power terminal VGH to fail to provide a high potential to the first anti-leakage node OFF2, and further cannot prevent the second power terminal VGL from pulling down the potential of the light-emitting cascade signal output terminal CR when the ninth transistor T9 and the fourteenth transistor T14 leak current, which causes unstable output of the light-emitting cascade signal and is easy to cause the problem of the erroneous output of the light-emitting cascade signal.

Figure 6A:
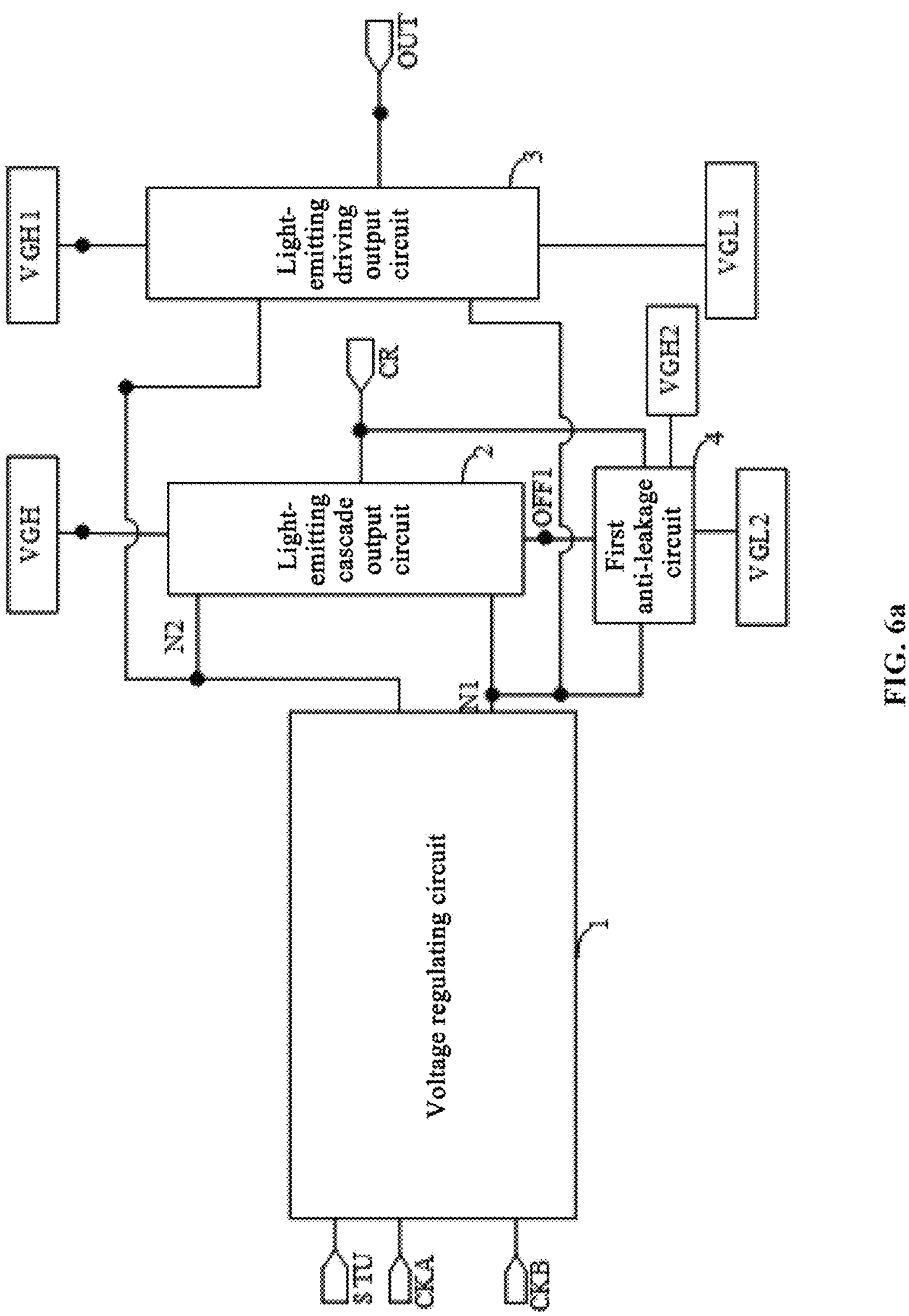
FIG. 6*a* is a schematic diagram of a circuit structure of a shift register according to embodiments of the present disclosure.

In order to solve the problem that an erroneous output of the light-emitting cascade signal easily occurs in the first shift register in the related art, embodiments of the present disclosure provide a shift register. FIG. 6*a* is a schematic diagram of a circuit structure of a shift register according to embodiments of the present disclosure. As shown in FIG. 6*a*, the shift register includes: a voltage regulating circuit 1, a light-emitting cascade output circuit 2, a light-emitting driving output circuit 3 and a first anti-leakage circuit 4.

The voltage regulating circuit 1 is electrically connected to the light-emitting signal input terminal STU, the first clock signal terminal CKA, the second clock signal terminal CKB, the first node N1, and the second node N2, and is configured to adjust the voltages at the first node N1 and the second node N2 in response to control of signals provided by the light-emitting signal input terminal STU, the first clock signal terminal CKA, and the second clock signal terminal CKB.

The light-emitting cascade output circuit 2 is electrically connected to the first power terminal VGH, the second power terminal VGL2, the light-emitting cascade signal output terminal CR, the first node N1, and the second node N2, and is configured to write the second operating voltage provided by the second power terminal VGL2 to the light-emitting cascade signal output terminal CR in response to control of the voltage at the first node N1, and write the first operating voltage provided by the first power terminal VGH to the light-emitting cascade signal output terminal CR in response to control of the voltage at the second node N2.

The light-emitting driving output circuit 3 is electrically connected to a fifth power terminal VGH1, a third power terminal VGL1, the light-emitting control driving signal output terminal OUT, the second node N2, the first node N1, and is configured to write a third operating voltage provided by the third power terminal VGL1 to the light-emitting control driving signal output terminal OUT in response to control of the voltage at the first node N1, and to write a fifth operating voltage provided by the fifth power terminal VGH1 to the light-emitting control driving signal output terminal OUT in response to control of the voltage at the second node N2.

The first anti-leakage circuit 4 is electrically connected to the light-emitting cascade output circuit 2 at the first anti-leakage node OFF1; and is further electrically connected to the first node N1, the second node N2, the second power terminal VGL2, and a fourth power terminal VGH2, and is configured to write a fourth operating voltage provided by the fourth power terminal VGH2 to the first anti-leakage node OFF1 in response to control of the voltage at the second node N2.

Figure 6B:
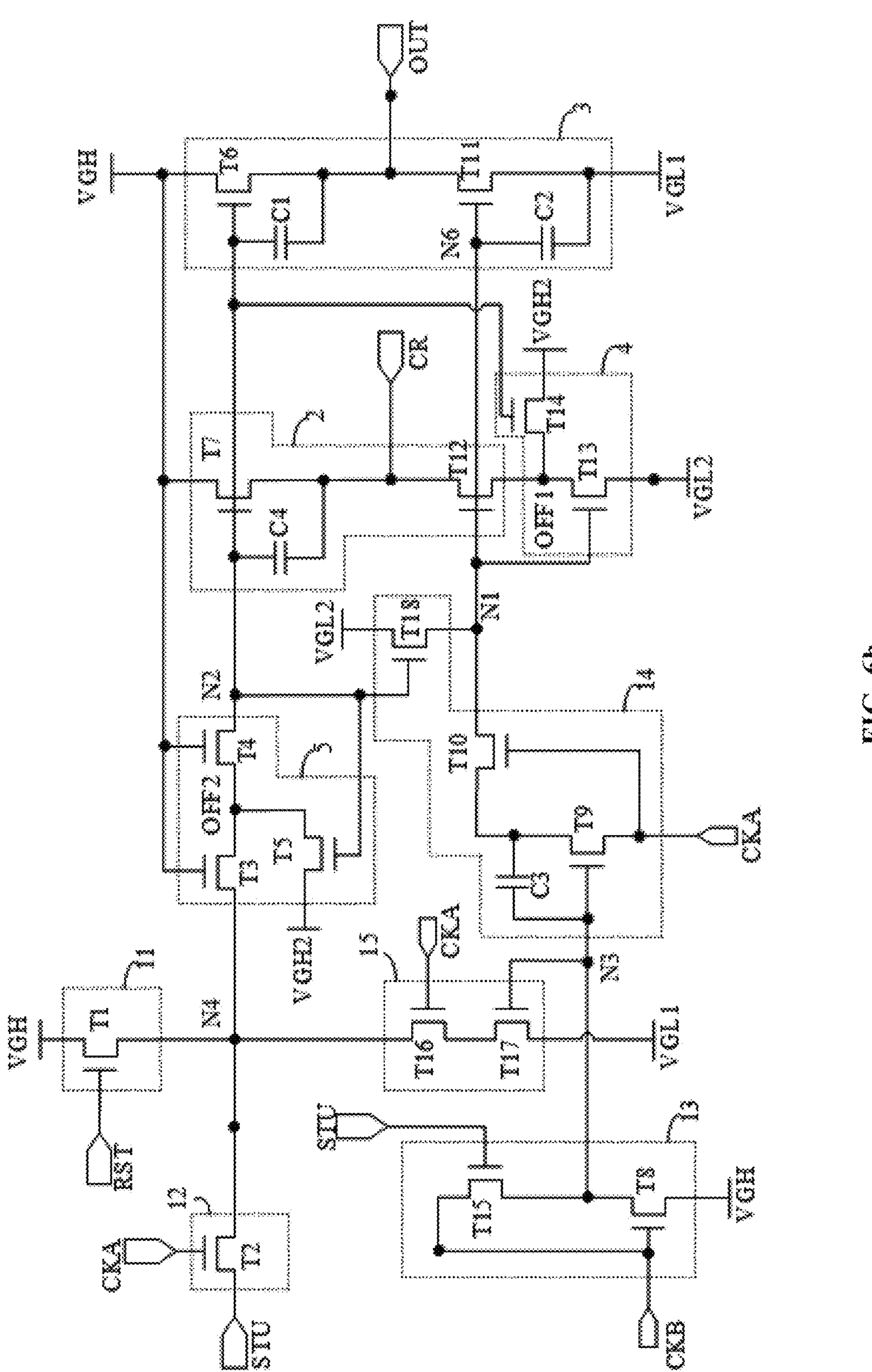
FIG. 6*b* is a schematic diagram of another circuit structure of a shift register according to embodiments of the present disclosure.
Figure 6B:
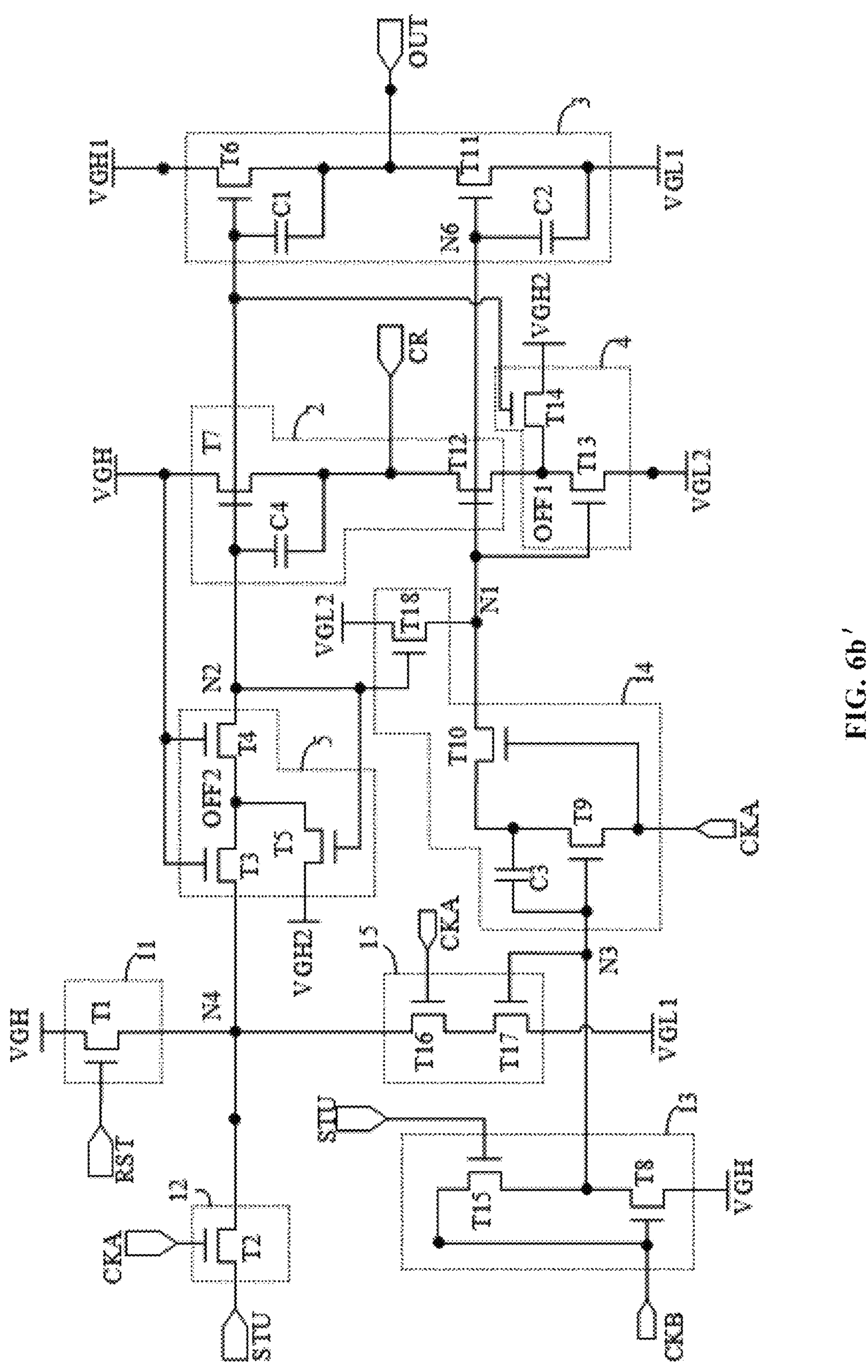

In some embodiments, FIG. 6*b* is a schematic diagram of another circuit structure of a shift register according to embodiments of the present disclosure. Referring to FIG. 6*b*, the first anti-leakage circuit 4 includes a thirteenth transistor T13 and a fourteenth transistor T14, a control electrode of the thirteenth transistor T13 is electrically connected to the first node N1, a first electrode of the thirteenth transistor T13 is electrically connected to the second power terminal VGL2, and a second electrode of the thirteenth transistor T13 is electrically connected to the first anti-leakage node OFF1 and a second electrode of the fourteenth transistor T14; a control electrode of the fourteenth transistor T14 is electrically connected to the second node N2, and a first electrode of the fourteenth transistor T14 is electrically connected to the fourth power terminal VGH2.

In this embodiment, compared to the scheme in the related art in which the control electrode of the fifteenth transistor is electrically connected to the light-emitting cascade signal output terminal, the control electrode of the fourteenth transistor T14 is electrically connected to the second node N2, so that during the light-emitting cascade signal output terminal CR does not output the light-emitting cascade signal (i.e., the low level signal), the second node N2 can be stably maintained at the high potential relatively, which turns on the fourteenth transistor T14, the fourth power terminal VGH2 provides the high potential to the first anti-leakage node OFF1, which can prevent the second power terminal VGL2 from pulling down the potential at the light-emitting cascade signal output terminal CR when an electric leakage occurs at the twelfth transistor T12 and the thirteenth transistor T13, so that the light-emitting cascade signal is ensured to be output stably, the erroneous output of the light-emitting cascade signal is not easily occurred, and the noise of the output signal of the shift register is reduced.

In some embodiments, referring to FIG. 6*b*, the shift register further includes a second anti-leakage circuit 5; the voltage regulating circuit 1 is electrically connected to the fourth node N4, and the second anti-leakage circuit 5 is located between the fourth node N4 and the second node N2; the second anti-leakage circuit 5 is further electrically connected to the first power terminal VGH and the fourth power terminal VGH2, and is configured to write the fourth operating voltage provided by the fourth power terminal VGH2 to a second anti-leakage node OFF2 under control of the voltage at the second node N2, and the second anti-leakage node OFF2 is located between the second node N2 and the fourth node N4.

In some embodiments, referring to FIG. 6*b*, the second anti-leakage circuit 5 includes a third transistor T3, a fourth transistor T4, and a fifth transistor T5; a control electrode of the third transistor T3 is electrically connected to the first power terminal VGH, a first electrode of the third transistor T3 is electrically connected to the fourth node N4, and a second electrode of the third transistor T3 is electrically connected to the second anti-leakage node OFF2; a control electrode of the fourth transistor T4 is electrically connected to the first power terminal VGH, a first electrode of the fourth transistor T4 is electrically connected to the second anti-leakage node OFF2, and a second electrode of the fourth transistor T4 is electrically connected to the second node N2; a control electrode of the fifth transistor T5 is electrically connected to the second node N2, a first electrode of the fifth transistor T5 is electrically connected to the fourth power terminal VGH2, and a second electrode of the fifth transistor T5 is electrically connected to the second anti-leakage node OFF2.

When the fifth transistor T5 is turned on, the fourth operating voltage provided by the fourth power terminal VGH2 is written to the second anti-leakage node OFF2 through the fifth transistor T5, and accordingly, the voltages at the fourth node N4 and the second node N2 are pulled up through the third transistor T3 and the fourth transistor T4. At this time, gate-source voltages of the third transistor T3 and the fourth transistor T4 are lowered until the gate-source voltage of the third transistor T3 is equal to a threshold voltage of the third transistor T3 and the gate-source voltage of the fourth transistor T4 is equal to a threshold voltage of the fourth transistor T4, the third transistor T3 and the fourth transistor T4 are both turned OFF. At this time, the second anti-leakage node OFF2 is in a floating state. Through the design, the second node N2 can be effectively prevented from generating an electric leakage through other transistors, so as to maintain the voltage at the second node N2 to be in a high level state all the time. It should be noted that during the second anti-leakage node OFF2 charges the fourth node N4 and the second node N2 through the third transistor T3 and the fourth transistor T4, the voltages at the fourth node N4 and the second node N2 are only slightly increased, so that the third transistor T3 and the fourth transistor T4 are turned off.

In some embodiments, referring to FIG. 6*b*, the light-emitting cascade output circuit 2 includes a seventh transistor T7 and a twelfth transistor T12; a control electrode of the twelfth transistor T12 is electrically connected to the first node N1, a first electrode of the twelfth transistor T12 is electrically connected to the first anti-leakage node OFF1, and a second electrode of the twelfth transistor T12 is electrically connected to the light-emitting cascade signal output terminal CR; a control electrode of the seventh transistor T7 is electrically connected to the second node N2, a first electrode of the seventh transistor T7 is electrically connected to the light-emitting cascade signal output terminal CR, and a second electrode of the seventh transistor T7 is electrically connected to the first power terminal VGH.

When the second node N2 outputs a high level signal, the fourteenth transistor T14 is turned on, and the fourth operating voltage provided by the fourth power terminal VGH2 is written to the first anti-leakage node OFF1 through the fourteenth transistor T14, so that the voltage at the light-emitting cascade signal output terminal CR can be effectively prevented from generating an electric leakage through the twelfth transistor T12, which is beneficial to maintaining the stability of the voltage at the light-emitting cascade signal output terminal.

In some embodiments, referring to FIG. 6*b*, the light-emitting cascade output circuit 2 further includes a fourth capacitor C4; a first terminal of the fourth capacitor C4 is electrically connected to the light-emitting cascade signal output terminal CR, and a second terminal of the fourth capacitor C4 is electrically connected to the second node N2. The fourth capacitor C4 is provided to improve the stability of the voltage at the second node N2.

In some embodiments, referring to FIG. 6*b*, the voltage regulating circuit 1 includes: a light-emitting global reset circuit 11 electrically connected to a light-emitting global reset signal terminal RST, the first power terminal VGH, the fourth node N4, and configured to write the first operating voltage provided by the first power terminal VGH to the fourth node N4 in response to control of a signal provided by the light-emitting global reset signal terminal RST.

In some embodiments, referring to FIG. 6*b*, the light-emitting global reset circuit 11 includes a first transistor T1; a control electrode of the first transistor T1 is electrically connected to the light-emitting global reset signal terminal RST, a first electrode of the first transistor T1 is electrically connected to the fourth node N4, and a second electrode of the first transistor T1 is electrically connected to the first power terminal VGH.

When the global reset is required, the light-emitting global reset signal terminal RST provides a high level signal (i.e., an active level signal) to turn on the first transistor T1 in the shift register. At this time, the first operating voltage provided by the first power terminal VGH is written to the fourth node N4 through the first transistor T1, so that the second node N2 is always in a high level state, thereby achieving the global reset. Currently, it will be appreciated by one of ordinary skill in the art that the shift register may optionally not include the light-emitting global reset circuit in some embodiments.

In some embodiments, referring to FIG. 6*b*, the voltage regulating circuit 1 includes: a first input circuit 12 electrically connected to the light-emitting signal input terminal STU, the first clock signal terminal CKA, and the fourth node N4, and configured to write a signal provided by the light-emitting signal input terminal STU to the fourth node N4 in response to control of a signal provided by the first clock signal terminal CKA.

The voltage regulating circuit 1 includes: a second input circuit 13 electrically connected to the light-emitting signal input terminal STU, the second clock signal terminal CKB, the first power terminal VGH, and the third node N3, and configured to write the first operating voltage provided by the first power terminal VGH to the third node N3 in response to control of a signal provided by the second clock signal terminal CKB, and write a signal provided by the second clock signal terminal CKB to the third node N3 in response to control of a signal provided by the light-emitting signal input terminal STU.

The voltage regulating circuit 1 includes: a first voltage control circuit 14 electrically connected to the first clock signal terminal CKA, the second power terminal VGL2, the first node N1, the second node N2, and the third node N3, and configured to write a signal provided by the first clock signal terminal CKA to the first node N1 in response to control of the voltage at the third node N3 and a signal provided by the first clock signal terminal CKA, and write the second operating voltage provided by the second power terminal VGL2 to the first node N1 in response to control of v voltage at the second node N2.

The voltage regulating circuit 1 includes: a second voltage control circuit 15 electrically connected to the first clock signal terminal CKA, the third power terminal VGL1, the third node N3, and the fourth node N4, and configured to write the voltage operating voltage provided by the third power terminal VGL1 to the fourth node N4 in response to the voltage at the third node N3 and a signal provided by the first clock signal terminal CKA.

In some embodiments, referring to FIG. 6*b*, the first input circuit 12 includes a second transistor T2, the second input circuit 13 includes an eighth transistor T8 and a fifteenth transistor T15, the first voltage control circuit 14 includes a ninth transistor T9, a tenth transistor T10, an eighteenth transistor T18 and a third capacitor C3, and the second voltage control circuit 15 includes a sixteenth transistor T16 and a seventeenth transistor T17.

A control electrode of the second transistor T2 is electrically connected to the first clock signal terminal CKA, a first electrode of the second transistor T2 is electrically connected to the light-emitting signal input terminal STU, and a second electrode of the second transistor T2 is electrically connected to the fourth node N4.

A control electrode of the eighth transistor T8 is electrically connected to the second clock signal terminal CKB, a first electrode of the eighth transistor T8 is electrically connected to the first power terminal VGH, and a second electrode of the eighth transistor T8 is electrically connected to the third node N3.

A control electrode of the fifteenth transistor T15 is electrically connected to the light-emitting signal input terminal STU, a first electrode of the fifteenth transistor T15 is electrically connected to the third node N3, and a second electrode of the fifteenth transistor T15 is electrically connected to the second clock signal terminal CKB.

A control electrode of the ninth transistor T9 is electrically connected to the third node N3, a first electrode of the ninth transistor T9 is electrically connected to the first clock signal terminal CKA, and a second electrode of the ninth transistor T9 is electrically connected to a second terminal of the third capacitor C3.

A control electrode of the tenth transistor T10 is electrically connected to the first clock signal terminal CKA, a first electrode of the tenth transistor T10 is electrically connected to the second terminal of the third capacitor C3, and a second electrode of the tenth transistor T10 is electrically connected to the first node N1.

A control electrode of the eighteenth transistor T18 is electrically connected to the second node N2, a first electrode of the eighteenth transistor T18 is electrically connected to the first node N1, and a second electrode of the eighteenth transistor T18 is electrically connected to the second power terminal VGL2.

A first terminal of the third capacitor C3 is electrically connected to the third node N3.

A control electrode of the seventeenth transistor T17 is electrically connected to the third node N3, a first electrode of the seventeenth transistor T17 is electrically connected to the third power terminal VGL1, and a second electrode of the seventeenth transistor T17 is electrically connected to a first electrode of the sixteenth transistor T16.

A control electrode of the sixteenth transistor T16 is electrically connected to the first clock signal terminal CKA, and a second electrode of the sixteenth transistor T16 is electrically connected to the fourth node N4.

In some embodiments, referring to FIG. 6*b*, the light-emitting driving output circuit 3 includes an eleventh transistor T11, a second capacitor C2, a first capacitor C1, and a sixth transistor T6.

A control electrode of the eleventh transistor T11 is electrically connected to the first node N1, a first electrode of the eleventh transistor T11 is electrically connected to the third power terminal VGL1, and a second electrode of the eleventh transistor T11 is electrically connected to the light-emitting control driving signal output terminal OUT.

A first terminal of the second capacitor C2 is electrically connected to the third power terminal VGL1, and a second terminal of the second capacitor C2 is electrically connected to the first node N1.

A control electrode of the sixth transistor T6 is electrically connected to the second node N2, a first electrode of the sixth transistor T6 is electrically connected to the light-emitting control driving signal output terminal OUT, and a second electrode of the sixth transistor T6 is electrically connected to the fifth power terminal VGH1.

A first terminal of the first capacitor C1 is electrically connected to the light-emitting control driving signal output terminal OUT, and a second terminal of the first capacitor C1 is electrically connected to the second node N2.

In some embodiments, referring to FIG. 6*b*, the fifth operating voltage provided by the fifth power terminal VGH1 is the same as the first operating voltage provided by the first power terminal VGH, and thus, the fifth power terminal VGH1 or the first power terminal VGH may not be provided.

In some embodiments, FIG. 6*b*' is a schematic diagram of another circuit structure of a shift register according to embodiments of the present disclosure.

Referring to FIG. 6*b*', the fifth operating voltage provided by the fifth power terminal VGH1 is different from the first operating voltage provided by the first power terminal VGH, i.e., it is necessary to separately provide the fifth power terminal VGH1 and the first power terminal VGH.

In some embodiments, referring to FIG. 6*b*, the fourth operating voltage provided by the fourth power terminal VGH2 is higher than the first operating voltage provided by the first power terminal VGH. For example, the fourth operating voltage provided by the fourth power terminal VGH2 is 4V higher than the first operating voltage as provided by the first power terminal VGH. The light-emitting cascade signal output terminal CR is at a high level, and a current flows from the first power terminal VGH to the second power terminal VGL2, which results in a voltage drop. With this arrangement, it is ensured that the high potential of the light-emitting cascade signal output terminal CR is not pulled down by the second power terminal VGL2 when the light-emitting cascade signal is not output (an active low level signal).

In some embodiments, referring to FIG. 6*b*, the second operating voltage provided by the second power terminal VGL2 is lower than the third operating voltage provided by the third power terminal VGL1. For example, the second operating voltage provided by the second power terminal VGL2 is 1V to 2V lower than the third operating voltage provided by the third power terminal VGL1. Thus, current directions of the twelfth transistor T12 and the thirteenth transistor T13 after the electric leakage can be ensured, and incomplete operation of a pull-down unit (i.e., the eleventh transistor T11) can be prevented, thereby avoiding the generation for the noise.

In some embodiments, referring to FIG. 6*b*, the eighth transistor T8 and the fifteenth transistor T15 maintain the synchronization of the third node N3 and the second clock signal terminal CKB when the light-emitting signal input terminal STU does not operate (in a high level state), and the light-emitting signal input terminal STU operates at a low potential (i.e., the light-emitting signal input terminal STU is active at a low level signal). The sixteenth transistor T16 and the seventeenth transistor T17 are inverters of the fourth node N4 and the third node N3 (i.e., one of the fourth node N4 and the third node N3 is at a high potential, and the other node of the fourth node N4 and the third node N3 is at a low potential); the ninth transistor T9, the tenth transistor T10, and the third capacitor C3 pull up the first node N1 to be at a high potential when the third node N3 is at a high potential, and the high potential at the first node N1 is maintained to be stable when the second node N2 is at a low potential; the eighteenth transistor T18 is an inverter of the second node N2 and the first node N1; the sixth transistor T6 is an output transistor, and the eleventh transistor T11 is a pull-down transistor; the light-emitting cascade signal output terminal CR is a carry unit, the light-emitting cascade signal output terminal CR of the previous stage of shift register is electrically connected to the light-emitting signal input terminal STU of the next stage of shift register, and the light-emitting cascade signal output terminal CR is used for providing input signals for the next row of pixel units.

In some embodiments, table 1 below shows channel width to length ratio parameters for the transistors in the shift register circuit in FIG. 6*b*; table 2 shows capacitance value parameters of the capacitors in the shift register circuit in FIG. 6*b*; table 3 shows voltage range parameters of the clock signal terminals, the signal input terminal, the reset signal terminal, and the power terminals in the shift register circuit in FIG. 6*b*.

TABLE 1

| Items | T1 | T2 | T3 | T4 | T5 | T6 | T7 | T8 | T9 |
|---|---|---|---|---|---|---|---|---|---|
| W/L(μm) | 20/6 | 50/6 | 300/6 | 300/6 | 20/6 | 2000/6 | 200/6 | 50/6 | 100/6 |
| Items | T10 | T11 | T12 | T13 | T14 | T15 | T16 | T17 | T18 |
| W/L(μm) | 300/6 | 1000/6 | 400/6 | 400/6 | 20/6 | 20/6 | 10/6 | 10/6 | 20/6 |

TABLE 2

| Items | C1 | C2 | C3 | C4 |
|---|---|---|---|---|
| Capacitance value | 2 pF | 0.5 pF | 0.5 pF | 2 pF |

TABLE 3

| Items | CKA | CKB | STU | RST | VGH | VGH2 | VGL1 | VGL2 |
|---|---|---|---|---|---|---|---|---|
| Voltage (V) | −8~24 | −8~24 | −8~20 | −8~24 | 20 | 24 | −6 | −8 |

Figure 6C:
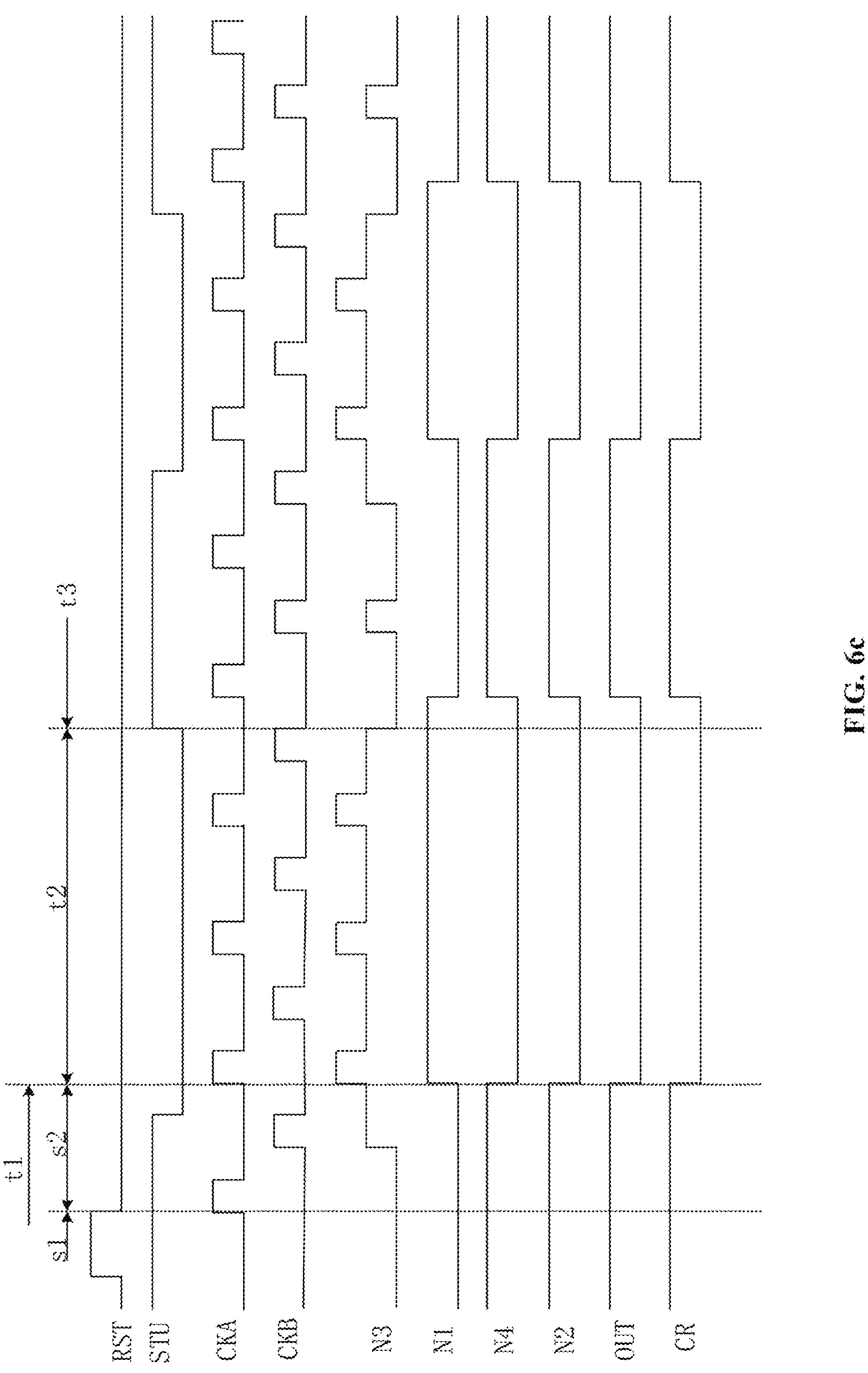
FIG. 6*c* is a timing diagram illustrating an operation of the shift register shown in FIG. 6*b*.

FIG. 6*c* is a timing diagram illustrating an operation of the shift register shown in FIG. 6*b*. Referring to FIG. 6*c*, the first operating voltage provided by the first power terminal VGH is a high level operating voltage, the second operating voltage provided by the second power terminal VGL2 is a low level operating voltage, the third operating voltage provided by the third power terminal VGL1 is a low level operating voltage, and the fourth operating voltage provided by the fourth power terminal VGH2 is a high level operating voltage. The light-emitting global reset signal terminal RST, the first clock signal terminal CKA and the second clock signal terminal CKB are active at high level signals; the light-emitting signal input terminal STU, the light-emitting control driving signal output terminal OUT, and the light-emitting cascade signal output terminal CR are active at low level signals. The process of outputting the light-emitting cascade signal by the light-emitting cascade signal output terminal in the shift register in FIG. 6*b* will be described in detail below. The process of outputting the light-emitting cascade signal in the shift register in FIG. 6*b* includes the following operation phases.

A reset phase t1 includes two sub-phases s1 and s2.

In the sub-phase s1: the light-emitting global reset signal terminal RST is changed from a low level signal to a high level signal, the first transistor T1 is turned on, and the fourth node N4 is returned to a high level; the third transistor T3 and the fourth transistor T4 are turned on, and the second node N2 is returned to a high level; and the sixth transistor T6 and the seventh transistor T7 are turned on, and the light-emitting control driving signal output terminal OUT and the light-emitting cascade signal output terminal CR are returned to a high level (that is, the light-emitting control driving signal output terminal OUT and the light-emitting cascade signal output terminal CR output no signal); the eighteenth transistor T18 is turned on, and the voltage at the first node N1 is pulled down by the second power terminal VGL2 to be lowest.

In the sub-phase s2: the light-emitting global reset signal terminal RST is changed from a high level signal to a low level signal, the second node N2 is at a high level, so that the fifth transistor T5 is turned on; and the fourth operating voltage provided by the fourth power terminal VGH2 turns off the third transistor T3 and the fourth transistor T4; the second node N2 is in a floating state; when the second clock signal terminal CKB is at a high level, the third node N3 is pulled up to be high by the first operating voltage provided by the first power terminal VGH and the high level signal of the second clock signal terminal CKB; when the second clock signal terminal CKB is at a low level, the third node N3 is at a low level, and thus when the light-emitting signal input terminal STU is at a high level, the signal at the third node N3 is changed with the signal at the second clock signal terminal CKB.

In a phase t2 of outputting signals by the light-emitting control driving signal output terminal OUT and the light-emitting cascade signal output terminal CR: when the light-emitting global reset signal terminal RST becomes a low level signal, the light-emitting signal input terminal STU outputs a low level signal, and the first clock signal terminal CKA outputs a high level signal, the low level signal output by the light-emitting signal input terminal STU is input to the fourth node N4, the sixteenth transistor T16 and the seventeenth transistor T17 are simultaneously turned on, and the fourth node N4 is at a low level; the third transistor T3 and the fourth transistor T4 are turned on, the second node N2 is pulled down to a low level, and the fifth transistor T5 is turned off; when the first clock signal terminal CKA is at a low level, the fourth node N4 and the second node N2 are floating and each is maintained at a low potential, and the sixth transistor T6 is turned off with the second node N2 at a low potential; the fifteenth transistor T15 is turned off; when the second clock signal terminal CKB outputs a high level signal, the eighth transistor T8 is turned on, the third node N3 becomes a high level; when the second clock signal terminal CKB outputs a low level signal, the third node N3 is maintained at a high level, the ninth transistor T9 is turned on; and when the first clock signal terminal CKA outputs a high level signal, due to the bootstrap action of the third capacitor C3, the third node N3 is bootstrapped to a voltage twice the high level voltage of the first clock signal terminal CKA, and becomes the same as the high level voltage of the first clock signal terminal CKA as the first clock signal terminal CKA becomes a low level; the process is repeated. The tenth transistor T10 is turned on, the first node N1 is pulled up to a high level; the eleventh transistor T11 is turned on, the light-emitting control driving signal output terminal OUT is pulled down by the third power terminal VGL1, and the light-emitting control driving signal output terminal OUT outputs a low level signal (an active level signal); therefore, when the light-emitting signal input terminal STU outputs a low level signal, on a first high level rising edge of the first clock signal terminal CKA, the light-emitting control driving signal output terminal OUT outputs the light-emitting control driving signal; and the second node N2 is at a low level and the first node N1 is at a high level, so that the twelfth transistor T12 and the thirteenth transistor T13 are turned on, the second power terminal VGL2 pulls down the potential of the light-emitting cascade signal output terminal CR, and the light-emitting cascade signal output terminal CR outputs a low level signal to the next row.

In an output end phase t3: the light-emitting signal input terminal STU becomes a high level, the signal at the third node N3 is changed with the signal at the second clock signal terminal CKB, the potential of the fourth node N4 is not pulled down by the sixteenth transistor T16 and the seventeenth transistor T17; after the light-emitting signal input terminal STU is changed to a high level from a low level, on a first high level rising edge of the first clock signal terminal CKA, the fourth node N4 starts to become a high level, and the second node N2 becomes a high level; the eighteenth transistor T18 is turned on, and the first node N1 is pulled down by the second power terminal VGL2; the sixth transistor T6 and the seventh transistor T7 are turned on again, and the light-emitting cascade signal output terminal CR and the light-emitting control driving signal output terminal OUT output a high level signal.

After the light-emitting signal input terminal STU is changed from a high level to a low level, the light-emitting control driving signal output terminal OUT starts to output a low level signal (an active light-emitting control driving signal) on a first high level rising edge of the first clock signal terminal CKA; after the light-emitting signal input terminal STU is changed from a low level to a high level, the light-emitting control driving signal output terminal OUT starts to output a high level signal on a first high level rising edge of the first clock signal terminal CKA.

When the second node N2 is at a high level, the fifth transistor T5 is turned on, and the high level signal at the fourth power terminal VGH2 is input to the second anti-leakage node OFF2, so that the gate-source voltage Vgs of each of the third transistor T3 and the fourth transistor T4 is less than the threshold voltage Vth thereof, the third transistor T3 and the fourth transistor T4 are turned off, and the second node N2 is maintained at the high level; the fourteenth transistor T14 is turned on when the second node N2 is at a high level, the high level signal at the fourth power terminal VGH2 is input to the first anti-leakage node OFF1, which avoids the case where the twelfth transistor T12 and the thirteenth transistor T13 are not completely turned off when the threshold voltages Vth of the twelfth transistor T12 and the thirteenth transistor T13 are drifted negatively, so as to prevent the current from being formed from the light-emitting cascade signal output terminal CR to the second power terminal VGL2, which causes a voltage drop, thereby preventing the voltage of the signal output by the light-emitting cascade signal output terminal CR from being lowered, effectively preventing the voltage at the light-emitting cascade signal output terminal CR from being leaked through the twelfth transistor T12, and facilitating to maintain the stability of the voltage at the light-emitting cascade signal output terminal.

Figure 6D:
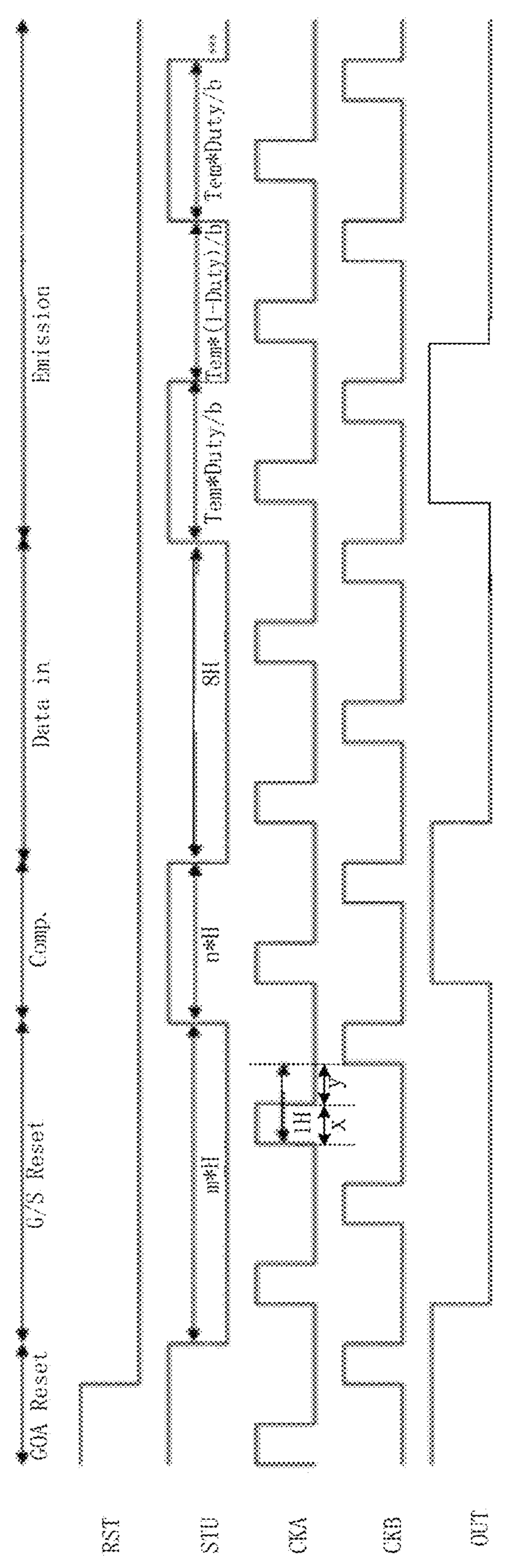
FIG. 6*d* is a schematic diagram illustrating the timing diagram of the operation of the shift register shown in FIG. 6*b* corresponding to operation phases of the pixel unit shown in FIG. 1.

FIG. 6*d* is a schematic diagram illustrating the timing diagram of the operation of the shift register shown in FIG. 6*b* corresponding to operation phases of the pixel unit shown in FIG. 1. In FIG. 6*d*, the EM-GOA refers to a shift register unit providing the light-emitting control driving signal EM to the pixel unit. A GOA Reset phase is an EM-GOA reset phase of the pixel unit. A G/S Reset refers to a reset phase of a gate electrode and a source electrode of the driving transistor in the pixel unit. COMP refers to a threshold voltage compensation phase of the driving transistor in the pixel unit; DATA IN refers to a charge phase of the pixel unit. Emission refers to the light-emitting phase of the pixel unit. FIG. 6*d* shows the timings of the light-emitting global reset signal terminal RST, the light-emitting signal input terminal STU, the first clock signal terminal CKA, the second clock signal terminal CKB and the light-emitting control driving signal output terminal OUT of the shift register in FIG. 6*b* at different operating phases of the pixel unit in FIG. 1. 8H phase of the light-emitting signal input terminal STU is a light-emitting signal input phase; a waveform of the light-emitting signal input terminal STU of the corresponding pixel unit in the light-emitting phase (Emission) is a dimming waveform (i.e., a waveform in which high levels and low levels are alternated), and the dimming waveform is a waveform for adjusting a light-emitting gray scale of the light-emitting element OLED in the pixel unit. It should be noted that if it is not necessary to adjust a light-emitting brightness (i.e. the light-emitting gray scale) of the light-emitting element OLED in the light-emitting phase of the pixel unit, the waveform of the light-emitting signal input terminal STU of the corresponding pixel unit in the light-emitting phase (Emission) is not the dimming waveform (i.e. the waveform is a waveform with a continuous high level).

In addition, it should be noted that when the light-emitting control driving signal EM output by the shift register in FIG. 6*b* needs to adjust the light-emitting brightness of the light-emitting element OLED, the light-emitting global reset signal terminal RST of the shift register in FIG. 6*b* is provided only in a first frame; when the light-emitting control driving signal EM output by the shift register in FIG. 6*b* does not need to adjust the light-emitting brightness of the light-emitting element OLED, the light-emitting global reset signal terminal RST of the shift register in FIG. 6*b* may be provided only in the first frame, or in every frame.

Referring to FIG. 6*d*, H is the scanning time of one row of pixel units; Tem is the light-emitting time of one row of pixel units, and Duty is a dimming duty ratio for dimming the light-emitting element OLED in the pixel unit; b is a dimming frequency; m and n are integers. A duty ratio of a signal at each of the first clock signal terminal CKA and the second clock signal terminal CKB is both in a range from 20% to 40%, and the first clock signal terminals CKA and the second clock signal terminals CKB of the upper and lower rows of pixel units are interchanged; in general, an interval between the time of outputting a signal by the first clock signal terminal CKA and the time of outputting a signal by the second clock signal terminal CKB is the light-emitting time of one row of pixel units, a sum of the time x of outputting a high level pulse by any one clock signal terminal (CKA or CKB) and a time difference y between the high level pulses of the first clock signal terminal CKA and the second clock signal terminal CKB is equal to the scanning time of one row of pixel units (x+y=1H); since the outputting of the light-emitting control driving signal EM by any stage of shift register depends on the first clock signal terminal CKA and the second clock signal terminal CKB, it is necessary to keep the interval for the first clock signal terminal CKA and the second clock signal terminal CKB (the interval between the time of outputting a signal by the first clock signal terminal CKA and the time of outputting a signal by the second clock signal terminal CKB) uniform, so that the active low level signal at the light-emitting signal input terminal STU is necessarily an integral multiple of x+y (i.e., 1H).

Figure 6E:
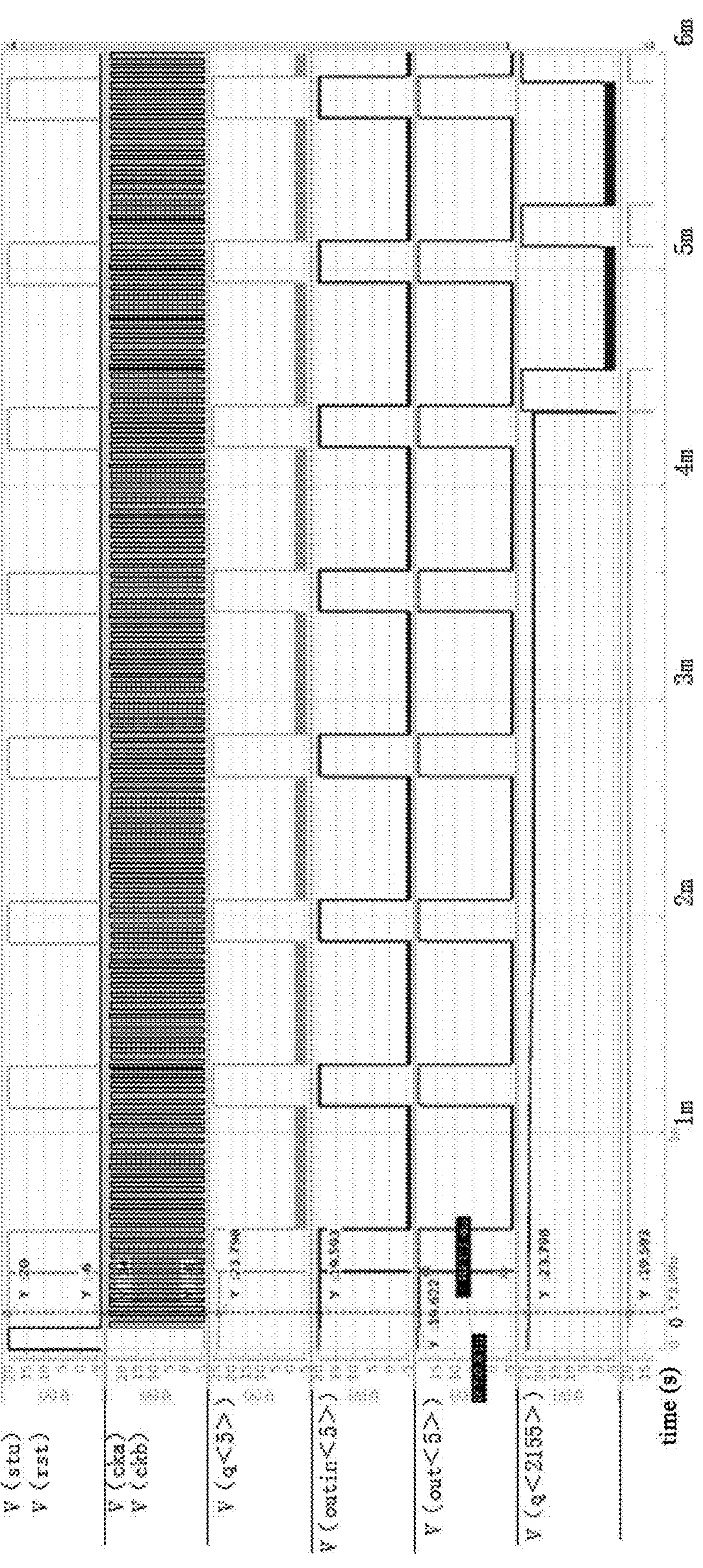
FIG. 6*e* is a schematic diagram showing simulation results of an operation of the shift register shown in FIG. 6*b*.

FIG. 6*e* is a schematic diagram showing simulation results of an operation of the shift register shown in FIG. 6*b*. By taking NMOS transistors as the transistors in the shift register as an example, a display refresh frequency is 120 Hz, H=3.7 μs, a duty ratio of each of the first clock signal terminal CKA and the second clock signal terminal CKB is 25%, and an active low level signal at the light-emitting signal input terminal STU is 3H (may alternatively be 6H or 8H). An operation simulation result of the shift register is shown in FIG. 6*e*, where V(stu) is a voltage waveform of a signal input at the light-emitting signal input terminal STU; V(rst) is a voltage waveform of a reset signal at the light-emitting global reset signal terminal RST; V(cka) and V(ckb) are voltage waveforms of the clock signals at the first clock signal terminal CKA and the second clock signal terminal CKB; V(q<5>) is a voltage waveform of the second node N2 of the pixel units in the fifth row; V(outin<5>) is a voltage waveform of the light-emitting control driving signal output terminal OUT at one terminal of the pixel units in the fifth row close to the shift register; V(out<5>) is a voltage waveform of the light-emitting control driving signal output terminal OUT at one terminal of the pixel units in the fifth row away from the shift register; V(q<2155>) is a voltage waveform at the second node N2 of the pixel units in the 2155th row. As can be seen from FIG. 6*e*, the waveforms of the simulation result are ideal to be regular rectangles, which shows that the shift register operates stably and can stably realize the light-emitting control of the pixel units.

Figure 7A:
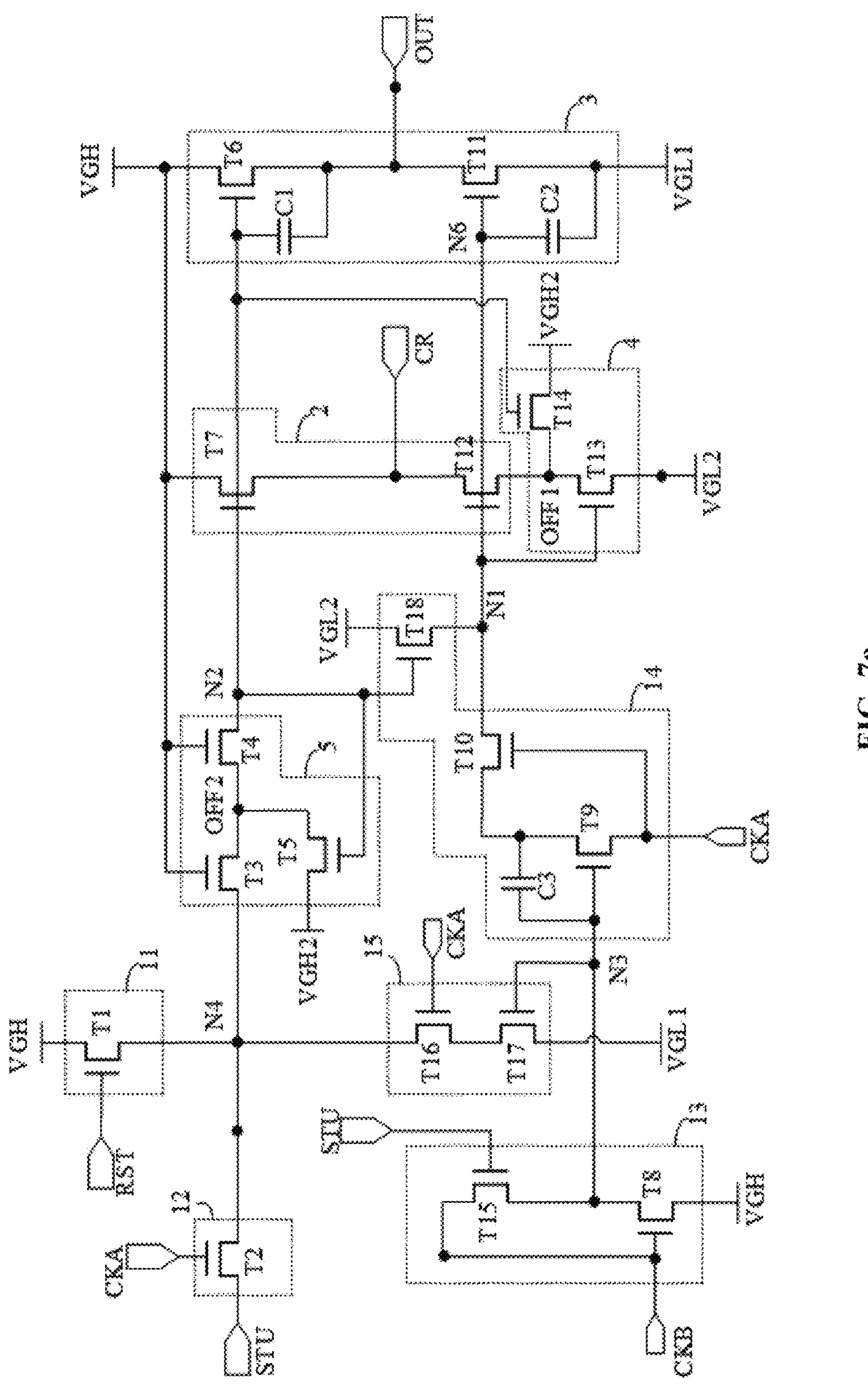
FIG. 7*a* is a schematic diagram of another circuit structure of a shift register according to embodiments of the present disclosure.

FIG. 7*a* is a schematic diagram of another circuit structure of a shift register according to embodiments of the present disclosure. Referring to FIG. 7*a*, compared to the shift register in FIG. 6*b*, in the shift register in FIG. 7*a*, the light-emitting cascade output circuit 2 does not include the fourth capacitor. Other components of the shift register in FIG. 7*a* are the same as those in FIG. 6*b*, and are not repeated here.

Figure 7B:
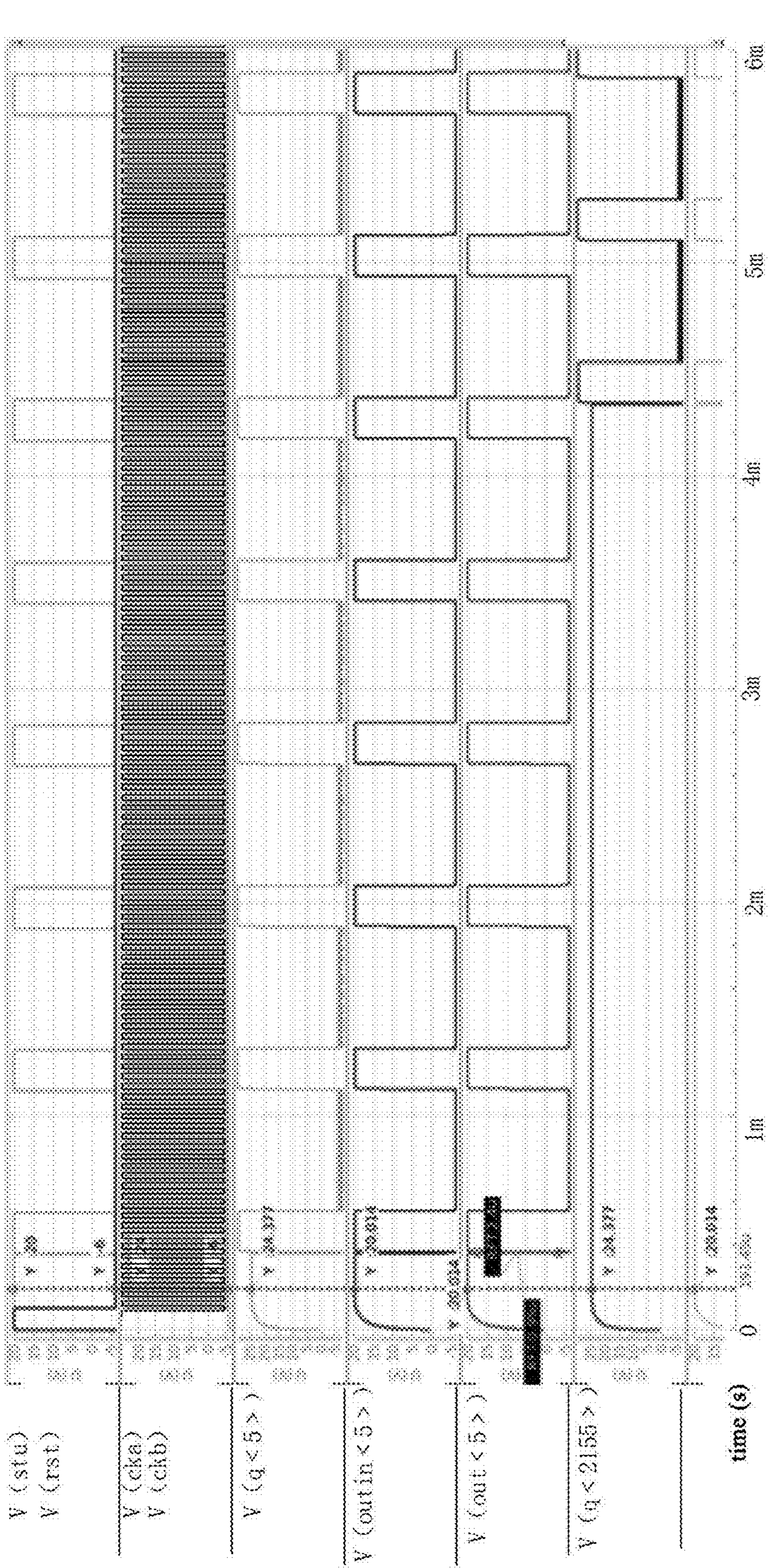
FIG. 7*b* is a schematic diagram showing simulation results of an operation of the shift register shown in FIG. 7*a*.

FIG. 7*b* is a schematic diagram showing simulation results of an operation of the shift register shown in FIG. 7*a*. Referring to FIG. 7*b*, by taking NMOS transistors as the transistors in the shift register as an example, a display refresh frequency is 120 Hz, H=3.7 μs, a duty ratio of each of the first clock signal terminal CKA and the second clock signal terminal CKB is 25%, and an active low level signal at the light-emitting signal input terminal STU is 3H (may alternatively be 6H or 8H). An operation simulation result of the shift register is shown in FIG. 7*b*, where V(stu) is a voltage waveform of a signal input at the light-emitting signal input terminal STU; V(rst) is a voltage waveform of a reset signal at the light-emitting global reset signal terminal RST; V(cka) and V(ckb) are voltage waveforms of the clock signals at the first clock signal terminal CKA and the second clock signal terminal CKB; V(q<5>) is a voltage waveform of the second node N2 of the pixel units in the fifth row; V(outin<5>) is a voltage waveform of the light-emitting control driving signal output terminal OUT at one terminal of the pixel units in the fifth row close to the shift register; V(out<5>) is a voltage waveform of the light-emitting control driving signal output terminal OUT at one terminal of the pixel units in the fifth row away from the shift register; V(q<2155>) is a voltage waveform at the second node N2 of the pixel units in the 2155th row. As can be seen from FIG. 7*b*, the waveforms of the simulation result are ideal, and are regular rectangles, which shows that the shift register operates stably, and can stably realize the light-emitting control driving of the pixel units.

Figure 8A:
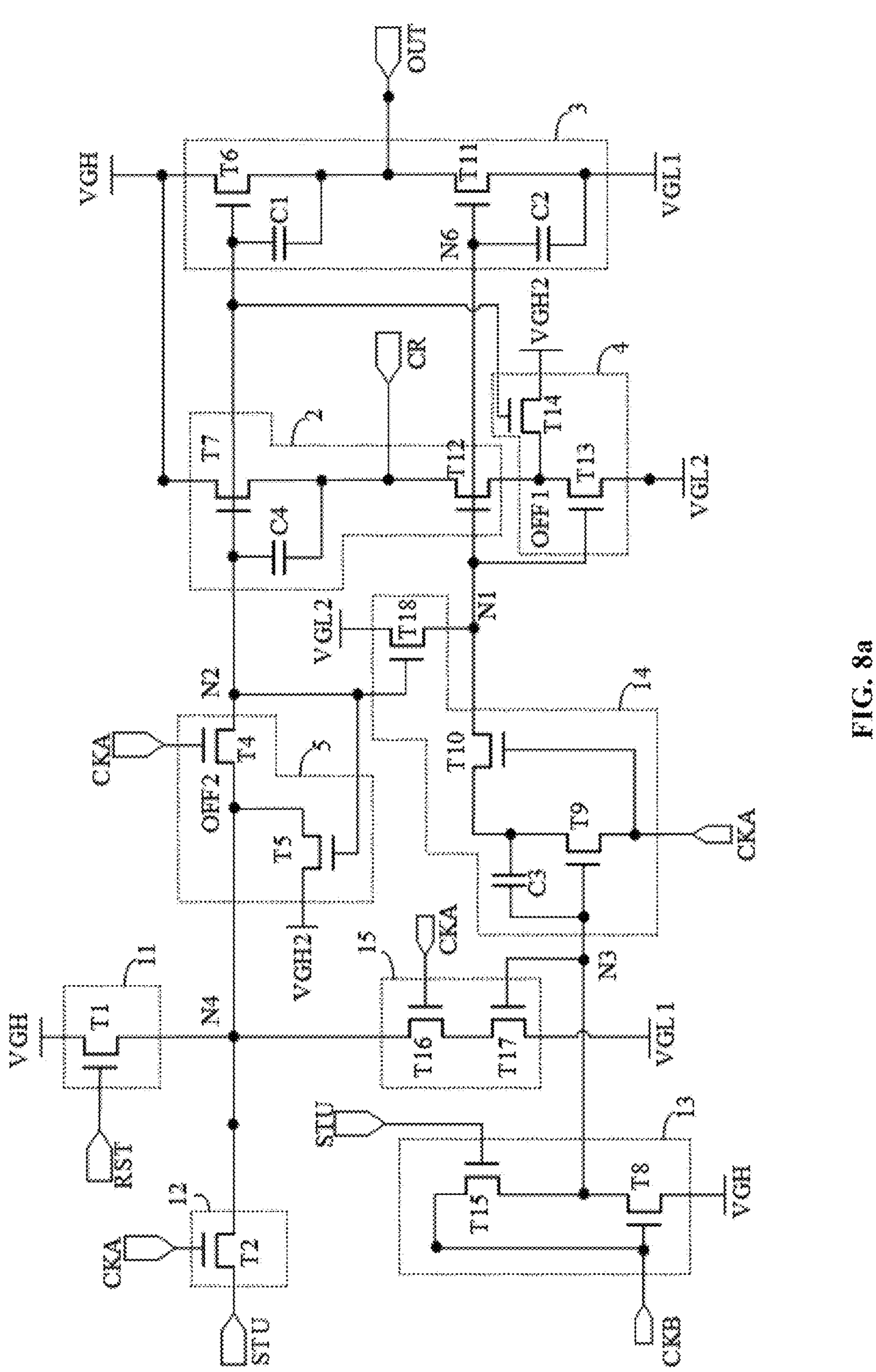
FIG. 8*a* is a schematic diagram of another circuit structure of a shift register according to embodiments of the present disclosure.

FIG. 8*a* is a schematic diagram of another circuit structure of a shift register according to embodiments of the present disclosure. Referring to FIG. 8*a*, the shift register further includes a second anti-leakage circuit 5, the voltage regulating circuit 1 is electrically connected to the fourth node N4, and the second anti-leakage circuit 5 is located between the fourth node N4 and the second node N2; the second anti-leakage circuit 5 is further electrically connected to the first clock signal terminal CKA and the fourth power terminal VGH2, and is configured to write the fourth operating voltage provided by the fourth power terminal VGH2 to the fourth node N4 under control of the voltage at the second node N2.

In some embodiments, referring to FIG. 8*a*, the second anti-leakage circuit 5 includes a fourth transistor T4 and a fifth transistor T5; a control electrode of the fourth transistor T4 is electrically connected to the first clock signal terminal CKA, a first electrode of the fourth transistor T4 is electrically connected to the second anti-leakage node OFF2, and a second electrode of the fourth transistor T4 is electrically connected to the second node N2; a control electrode of the fifth transistor T5 is electrically connected to the second node N2, a first electrode of the fifth transistor T5 is electrically connected to the fourth power terminal VGH2, and a second electrode of the fifth transistor is electrically connected to the second anti-leakage node OFF2.

Figure 8B:
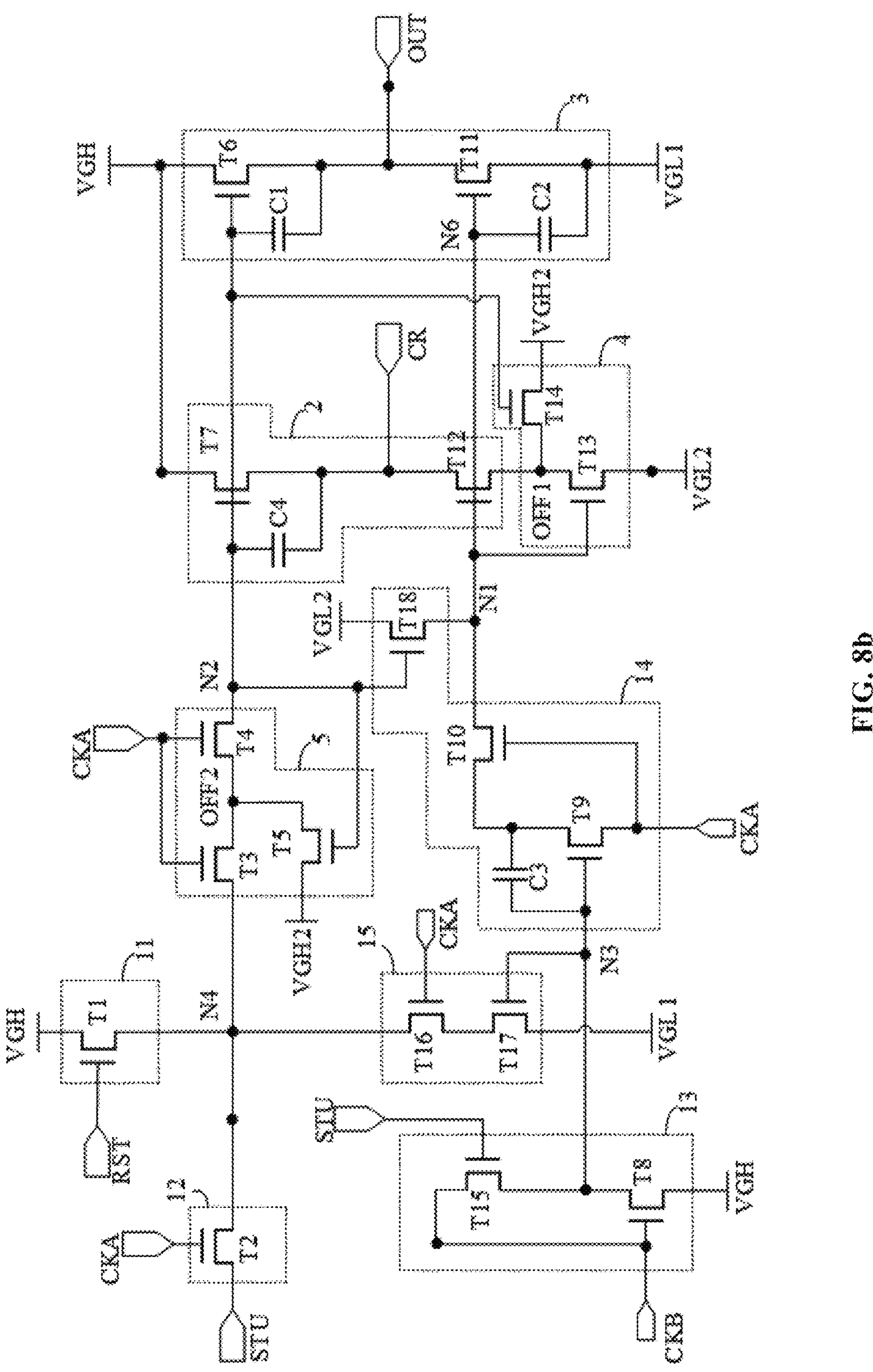
FIG. 8*b* is a schematic diagram of another circuit structure of a shift register according to embodiments of the present disclosure.

FIG. 8*b* is a schematic diagram of another circuit structure of a shift register according to embodiments of the present disclosure. Referring to FIG. 8*b*, the second anti-leakage circuit 5 includes a third transistor T3, a fourth transistor T4, and a fifth transistor T5; a control electrode of the third transistor T3 is electrically connected to the first clock signal terminal CKA, a first electrode of the third transistor T3 is electrically connected to the fourth node N4, and a second electrode of the third transistor T3 is electrically connected to the second anti-leakage node OFF2.

A control electrode of the fourth transistor T4 is electrically connected to the first clock signal terminal CKA, a first electrode of the fourth transistor T4 is electrically connected to the second anti-leakage node OFF2, and a second electrode of the fourth transistor T4 is electrically connected to the second node N2.

A control electrode of the fifth transistor T5 is electrically connected to the second node N2, a first electrode of the fifth transistor T5 is electrically connected to the fourth power terminal VGH2, and a second electrode of the fifth transistor T5 is electrically connected to the second anti-leakage node OFF2.

Figure 9A:
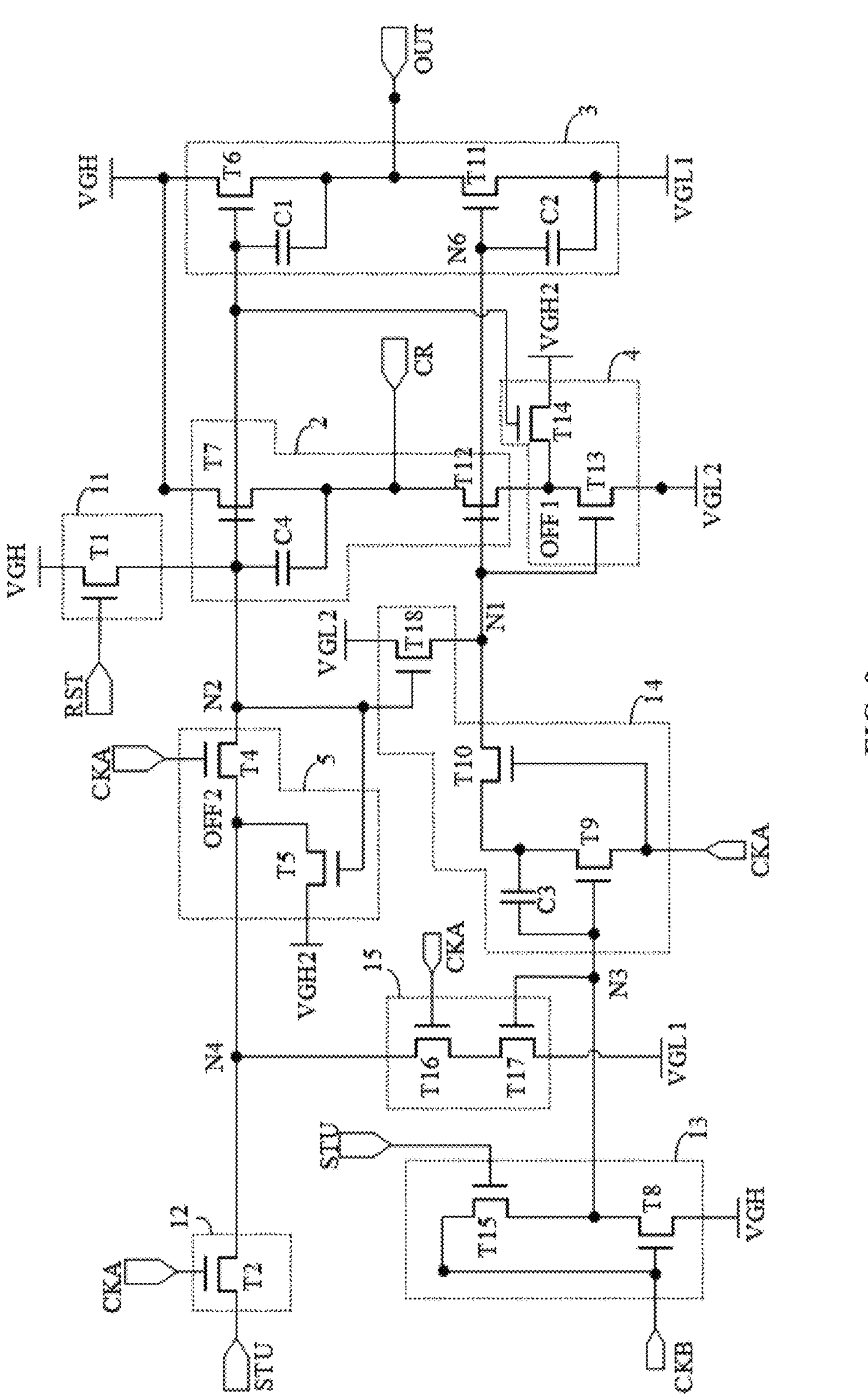
FIG. 9*a* is a schematic diagram of another circuit structure of a shift register according to embodiments of the present disclosure.

On the basis of the circuit structure of the shift register shown in FIG. 8*a*, FIG. 9*a* is a schematic diagram of another circuit structure of a shift register according to embodiments of the present disclosure. Referring to FIG. 9*a*, the voltage regulating circuit 1 includes: a light-emitting global reset circuit 11 electrically connected to the light-emitting global reset signal terminal RST, the first power terminal VGH, the second node N2, and configured to write the first operating voltage provided by the first power terminal VGH to the second node N2 in response to control of a signal provided by the light-emitting global reset signal terminal RST.

In some embodiments, referring to FIG. 9*a*, the light-emitting global reset circuit 11 includes a first transistor T1; a control electrode of the first transistor T1 is electrically connected to the light-emitting global reset signal terminal RST, a first electrode of the first transistor T1 is electrically connected to the second node N2, and a second electrode of the first transistor T1 is electrically connected to the first power terminal VGH. In this way, the reset signal from the light-emitting global reset signal terminal RST can directly reset the potential at the second node N2, i.e., the light-emitting global reset signal terminal RST directly pulls up the potential at the second node N2.

Figure 9B:
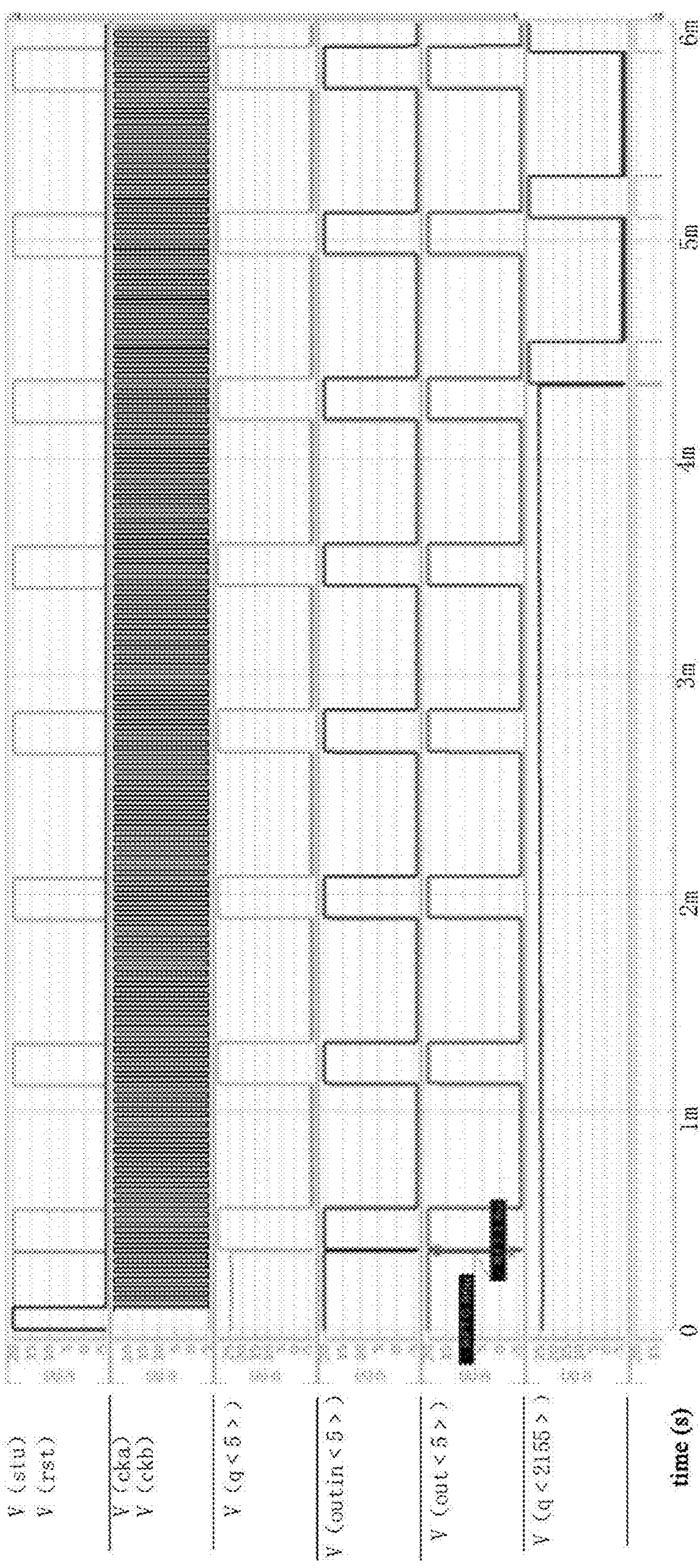
FIG. 9*b* is a schematic diagram showing simulation results of an operation of the shift register shown in FIG. 9*a*.

FIG. 9*b* is a schematic diagram showing simulation results of an operation of the shift register shown in FIG. 9*a*. Referring to FIG. 9*b*, by taking NMOS transistors as the transistors in the shift register as an example, a display refresh frequency is 120 Hz, H=3.7 s, a duty ratio of each of the first clock signal terminal CKA and the second clock signal terminal CKB is 25%, and an active low level signal at the light-emitting signal input terminal STU is 3H (may alternatively be 6H or 8H). An operation simulation result of the shift register is shown in FIG. 9*b*, where V(stu) is a voltage waveform of a signal input at the light-emitting signal input terminal STU; V(rst) is a voltage waveform of a reset signal at the light-emitting global reset signal terminal RST; V(cka) and V(ckb) are voltage waveforms of the clock signals at the first clock signal terminal CKA and the second clock signal terminal CKB; V(q<5>) is a voltage waveform of the second node N2 of the pixel units in the fifth row; V(outin<5>) is a voltage waveform of the light-emitting control driving signal output terminal OUT at one terminal of the pixel units in the fifth row close to the shift register; V(out<5>) is a voltage waveform of the light-emitting control driving signal output terminal OUT at one terminal of the pixel units in the fifth row away from the shift register; V(q<2155>) is a voltage waveform at the second node N2 of the pixel units in the 2155th row. As can be seen from FIG. 9*b*, the waveforms of the simulation result are ideal, and are regular rectangles, which show that the shift register operates stably, and can stably realize the light-emitting control driving of the pixel units.

Figure 10:
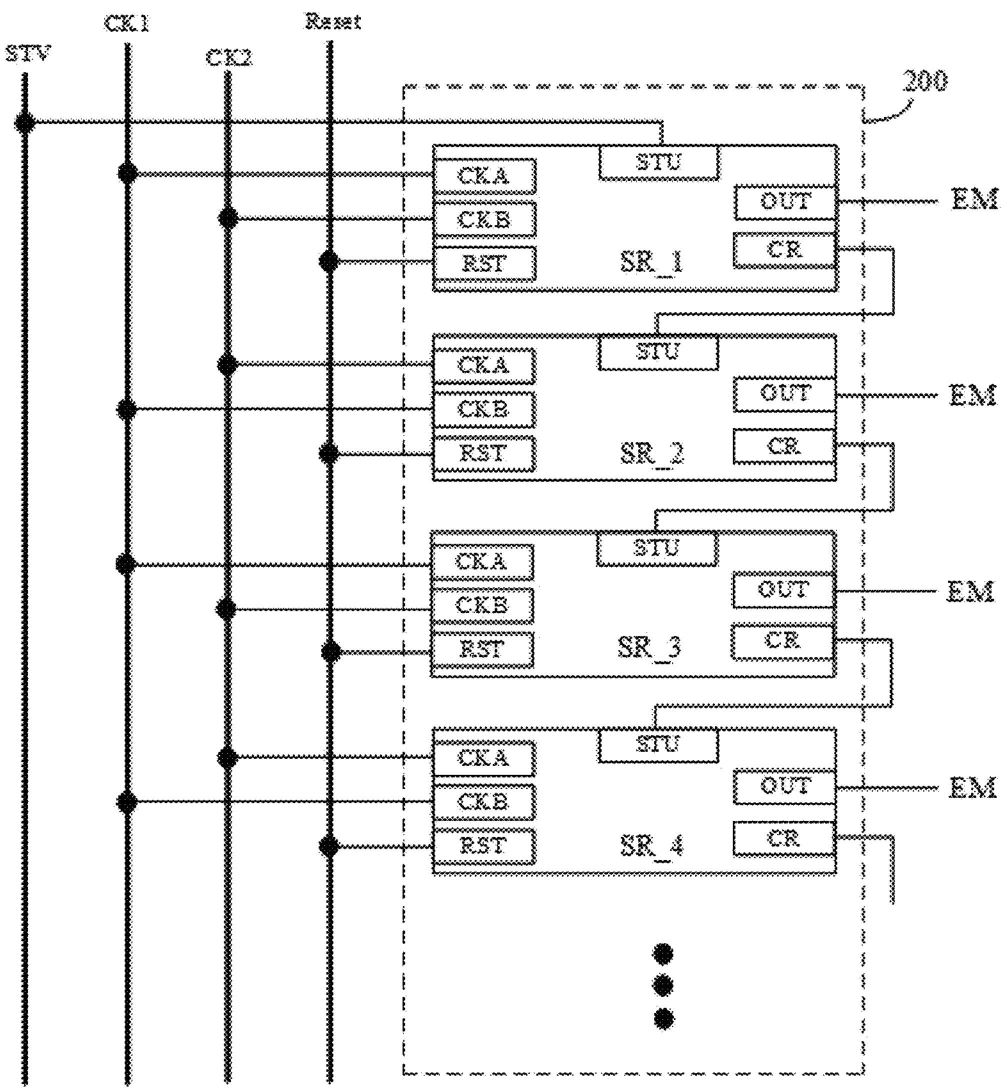
FIG. 10 is a schematic diagram of a circuit structure of a gate driving circuit according to embodiments of the present disclosure.

Based on the same inventive concept, embodiments of the present disclosure further provide a gate driving circuit. FIG. 10 is a schematic diagram of a circuit structure of a gate driving circuit according to embodiments of the present disclosure. Referring to FIG. 10, the gate driving circuit 200 includes: a plurality of cascaded first shift registers SR_1, SR_2, SR_3 and SR_4, each of which adopts the shift register in the above embodiments; a light-emitting signal input terminal STU of the first shift register SR_1 at the first stage is electrically connected to a light-emitting start signal line STV, and the first shift registers SR_2, SR_3, and SR_4 at the stages other than the first stage are electrically connected to light-emitting cascade signal output terminals CR of the first shift registers at the respective previous stages; the light-emitting control driving signal output terminals OUT of the first shift registers SR_1, SR_2, SR_3, and SR_4 are electrically connected to corresponding light-emitting control signal lines EM.

In some embodiments, a first clock signal line CK1 and a second clock signal line CK2 are provided for the gate driving circuit; the first clock signal terminals CKA of the first shift registers at the odd stages in the gate driving circuit are electrically connected to the first clock signal line CK1, the second clock signal terminals CKB of the first shift registers at the odd stages are electrically connected to the second clock signal line CK2, the first clock signal terminals CKA of the first shift registers at the even stages are electrically connected to the second clock signal line CK2, and the second clock signal terminals CKB of the first shift registers at the even stages are electrically connected to the first clock signal line CK1.

When the light-emitting global reset circuit is provided in the first shift register in the gate driving circuit, the gate driving circuit is further provided with a light-emitting global reset signal line Reset, and the light-emitting global reset signal terminals RST provided for the first shift registers in the stages are electrically connected to the same light-emitting global reset signal line Reset.

Figure 11:
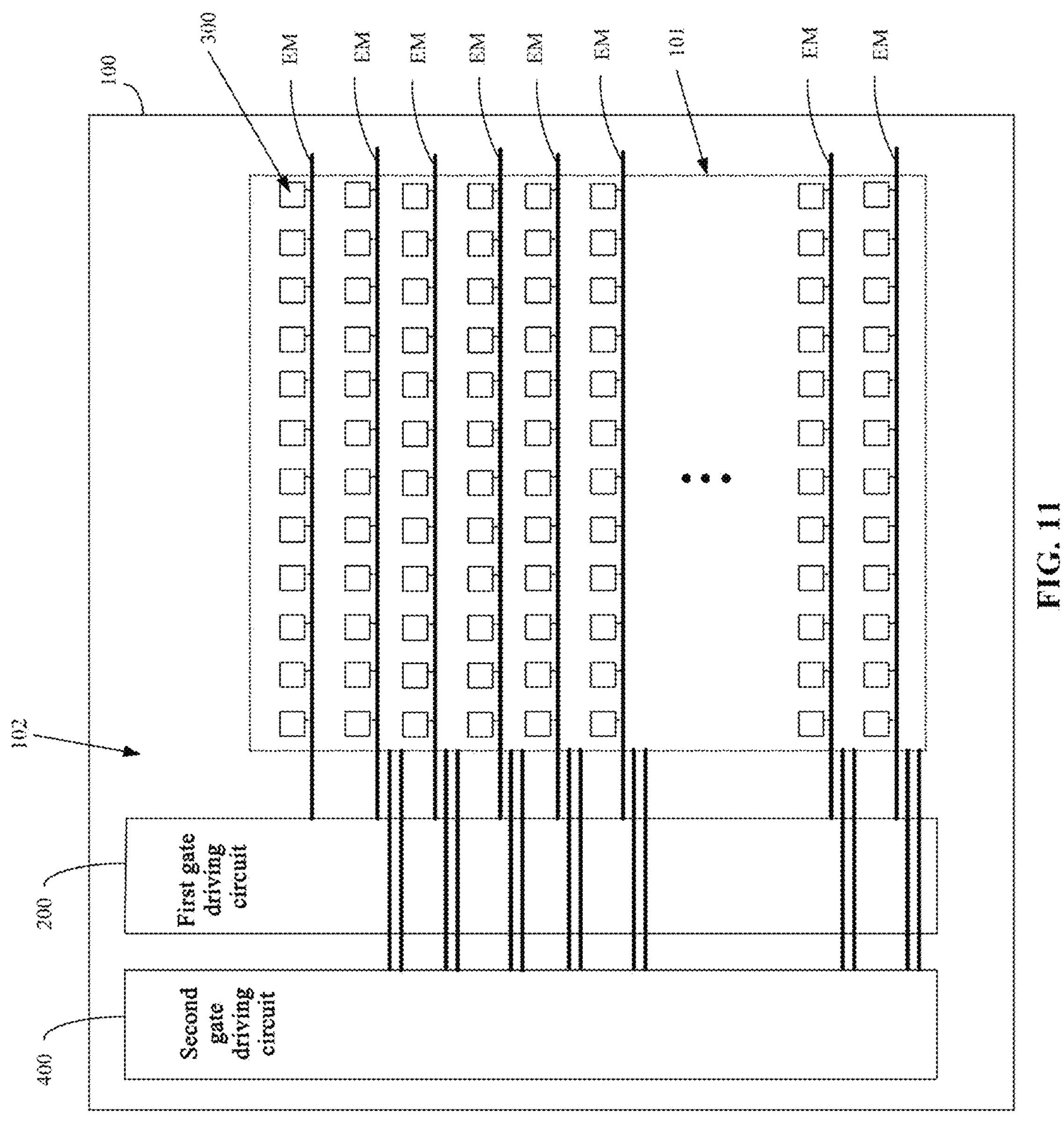
FIG. 11 is a schematic diagram of a structure of a display apparatus according to embodiments of the present disclosure.

Based on the same inventive concept, the embodiments of the present disclosure further provide a display apparatus. FIG. 11 is a schematic diagram of a structure of a display apparatus according to embodiments of the present disclosure. The display apparatus 100 includes a display region 101 and a peripheral region 102 located at a periphery of the display region 101, the display region 101 includes a plurality of pixel units 300 arranged in an array therein, each row of pixel units is configured with a corresponding light-emitting control signal line EM electrically connected to a control electrode of an light-emitting control transistor in the corresponding pixel unit 300; the peripheral region 102 includes a first gate driving circuit 200 for providing a light-emitting control signal to the light-emitting control signal line EM therein, and the first gate driving circuit 200 employs the gate driving circuit in the above embodiments.

In some embodiments, the pixel unit 300 in the embodiments of the present disclosure may adopt the structure of 4T1C shown in FIG. 1. For the first gate line G1 and the second gate line G2 in the display region 100, a corresponding second gate driving circuit 400 may be disposed in the peripheral region, and includes a plurality of cascaded second shift registers (not shown in FIG. 11), and the second shift registers may not only provide the gate driving signals to the second gate line G2 disposed on the pixel units in the corresponding row, but also provide the gate driving signals to the first gate line G1 disposed on the pixel units in the corresponding row at the same time. That is, the second gate driving circuit 400 may be used to simultaneously drive the first gate line G1 and the second gate line G2.

Figure 12:
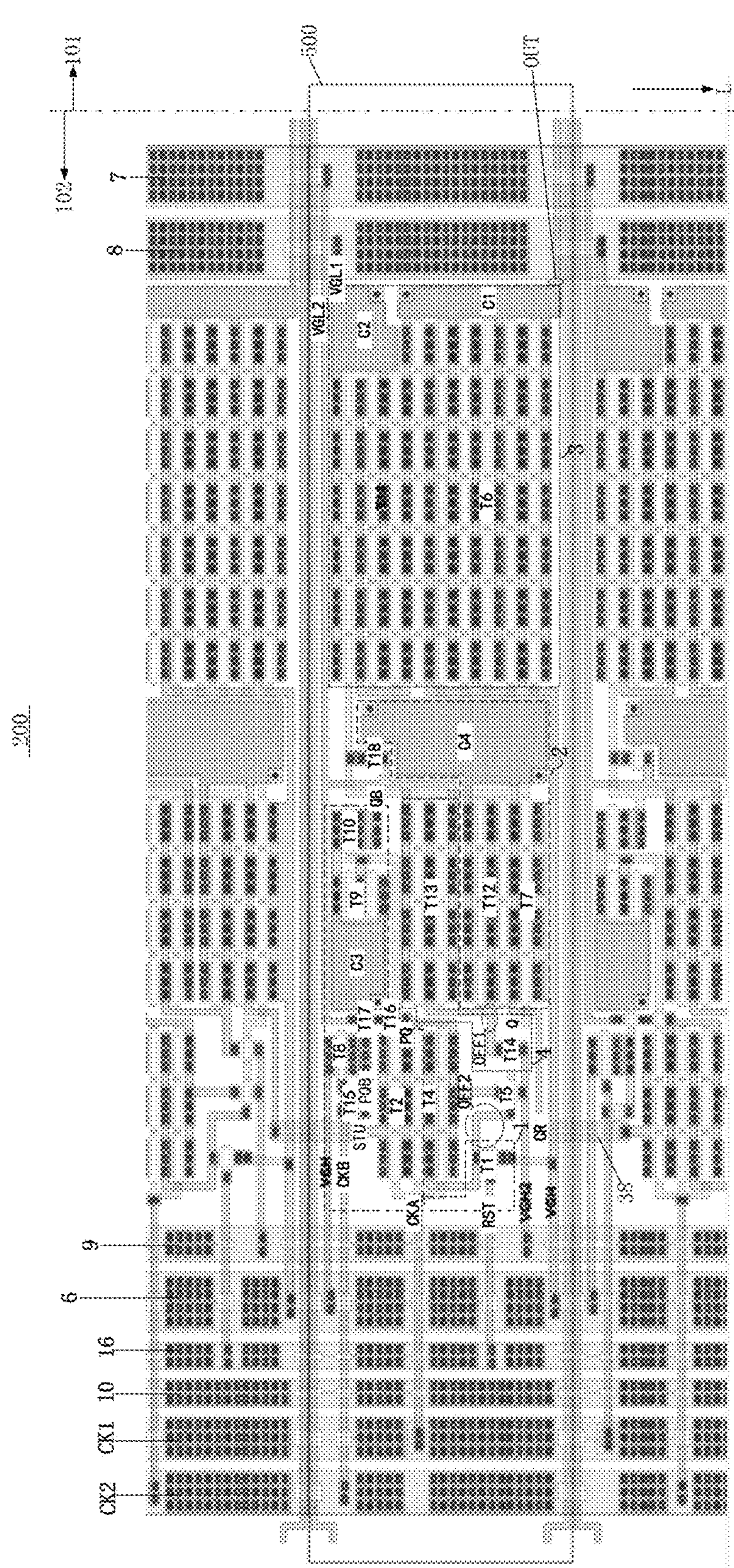
FIG. 12 is a layout of a first shift register in a first gate driving circuit according to embodiments of the present disclosure.

In some embodiments, FIG. 12 is a layout of a first shift register in a first gate driving circuit according to embodiments of the present disclosure. Referring to FIG. 12, the light-emitting driving output circuit 3, the light-emitting cascade output circuit 2, and the voltage regulating circuit 1 of the first shift register 500 in the first gate driving circuit 200 are sequentially distributed in a direction away from the display region 101; the first anti-leakage circuit 4 of the first shift register 500 is located in a region between the light-emitting driving output circuit 3 and the voltage regulating circuit 1.

In some embodiments, referring to FIG. 12, the first power terminal VGH is electrically connected to a first power signal line 6; the second power terminal VGL2 is electrically connected to a second power signal line 7; the third power terminal VGL1 is electrically connected to a third power signal line 8; the fourth power terminal VGH2 is electrically connected to a fourth power signal line 9; the first clock signal terminal CKA is electrically connected to the first clock signal line CK1; the second clock signal terminal CKB is electrically connected to the second clock signal line CK2; the light-emitting signal input terminal STU is electrically connected to a light-emitting signal input line 10; the light-emitting global reset signal terminal RST is electrically connected to the light-emitting global reset signal line 16.

The second clock signal line CK2, the first clock signal line CK1, the light-emitting signal input line 10, the light-emitting global reset signal line 16, the first power signal line 6, and the fourth power signal line 9 are located on a side of the voltage regulating circuit 1 away from the display region 101, and are distributed sequentially in a direction close to the display region 101.

The third power signal line 8 and the second power signal line 7 are located on a side of the light-emitting driving output circuit 3 close to the display region 101, and are distributed sequentially in a direction close to the display region 101.

Figure 13A:
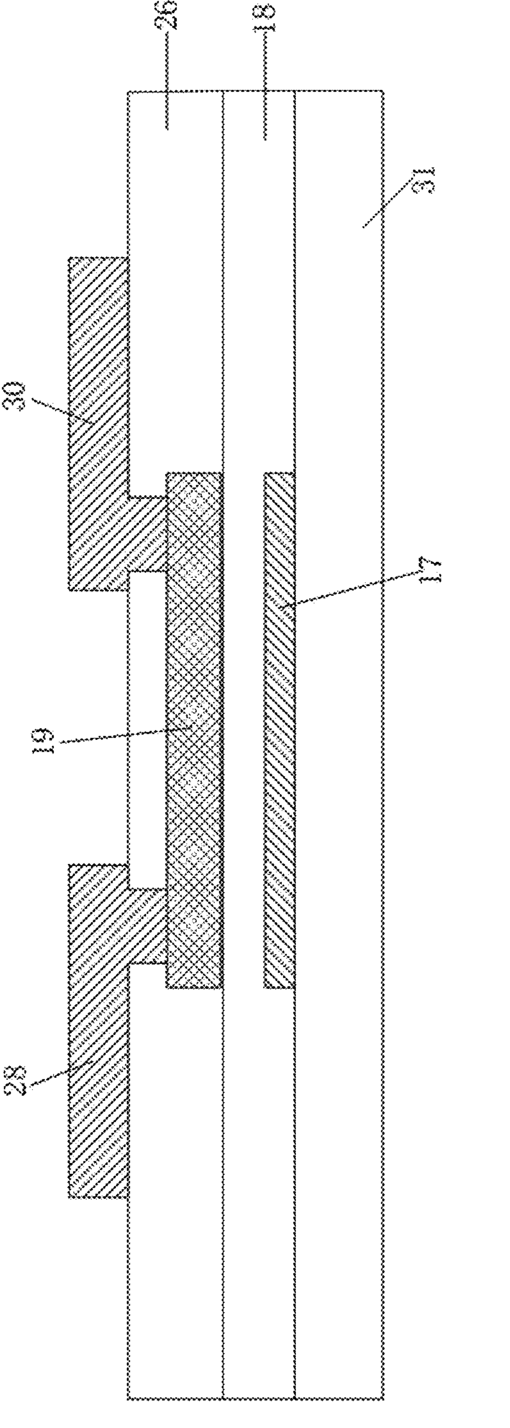
FIG. 13*a* is a cross-sectional view of a structure of any transistor in a first shift register according to embodiments of the present disclosure.

In some embodiments, FIG. 13*a* is a cross-sectional view of a structure of any transistor in a first shift register according to embodiments of the present disclosure. Referring to FIG. 13*a*, the transistor includes a gate electrode 17 (i.e., a control electrode), a gate insulating layer 18, an active layer 19, an intermediate insulating layer 26, a first electrode 28, and a second electrode 30, which are sequentially stacked on a substrate 31, and the first electrode 28 and the second electrode 30 are disposed in the same layer. Orthographic projections of the active layer and the gate electrode 17 on the substrate 31 overlap with each other. The first electrode 28 and the second electrode 30 are electrically connected to the active layer 19 through vias formed in the intermediate insulating layer 26.

Referring to FIGS. 12 and 13*a*, the first clock signal line CK1, the second clock signal line CK2, the light-emitting signal input line 10, the light-emitting global reset signal line 16, the first power signal line 6 and the fourth power signal line 9, and the third power signal line 8 and the second power signal line 7 are respectively formed in two conductive layers, a first conductive layer of the two conductive layers is disposed in the same layer as the gate electrode 17, a second conductive layer is disposed in the same layer as the first electrode 28 and the second electrode 30; orthographic projections of the second conductive layer and the first conductive layer on the substrate 31 overlap with each other, and the second conductive layer and the first conductive layer are electrically connected to each other through vias formed in the intermediate insulating layer 26 and the gate insulating layer 18. A first plate of any capacitor in the first shift register 500 is disposed in the same layer as the gate electrode 17, and the second plate is disposed in the same layer as the first and second electrodes 28 and 30, and orthographic projections of the first and second plates on the substrate 31 overlap with each other.

Referring to FIG. 12, the lines for the electrical connection among the transistors and the lines for the electrical connection among the transistors and the capacitors and the lines for the electrical connection among the transistors and the capacitors and the first clock signal line CK1, the second clock signal line CK2, the light-emitting signal input line 10, the light-emitting global reset signal line 16, the first power signal line 6, the fourth power signal line 9, the third power signal line 8, and the second power signal line 7 in the first shift register 500 are all located on a layer where the first electrode 28 and the second electrode 30 are located.

Figure 13B:
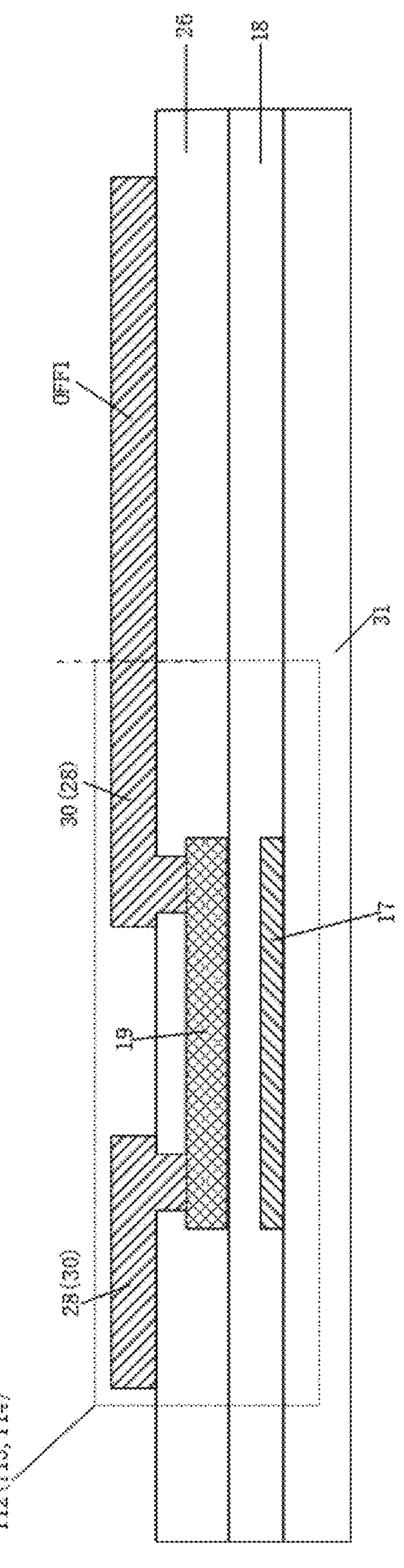
FIG. 13*b* is a cross-sectional view of a structure at a first anti-leakage node in a first shift register according to embodiments of the present disclosure.

In some embodiments, FIG. 13*b* is a cross-sectional view of a structure at a first anti-leakage node in a first shift register according to embodiments of the present disclosure. Referring to FIGS. 12 and 13*b*, the first anti-leakage node OFF1 is disposed in the same layer as the first electrode 28 of the twelfth transistor T12, the second electrode 30 of the thirteenth transistor T13, and the second electrode 30 of the fourteenth transistor T14; and the first electrode 28 of the twelfth transistor T12 and the second electrode 30 of the thirteenth transistor T13 extend along a direction away from the display region 101 to the second electrode 30 of the fourteenth transistor T14, so that the first anti-leakage node OFF1 is electrically connected to the second electrode 30 of the fourteenth transistor T14; the first and second electrodes 28 and 30 of the twelfth transistor T12, the first and second electrodes 28 and 30 of the thirteenth transistor T13, and the first and second electrodes 28 and 30 of the fourteenth transistor T14 are disposed in the same layer; the control electrodes (i.e., the gate electrodes 17), the active layers 19 and the first electrodes 28 of the twelfth transistor T12, the thirteenth transistor T13 and the fourteenth transistor T14 are sequentially disposed on the substrate 31.

Figures 13C, 13D:
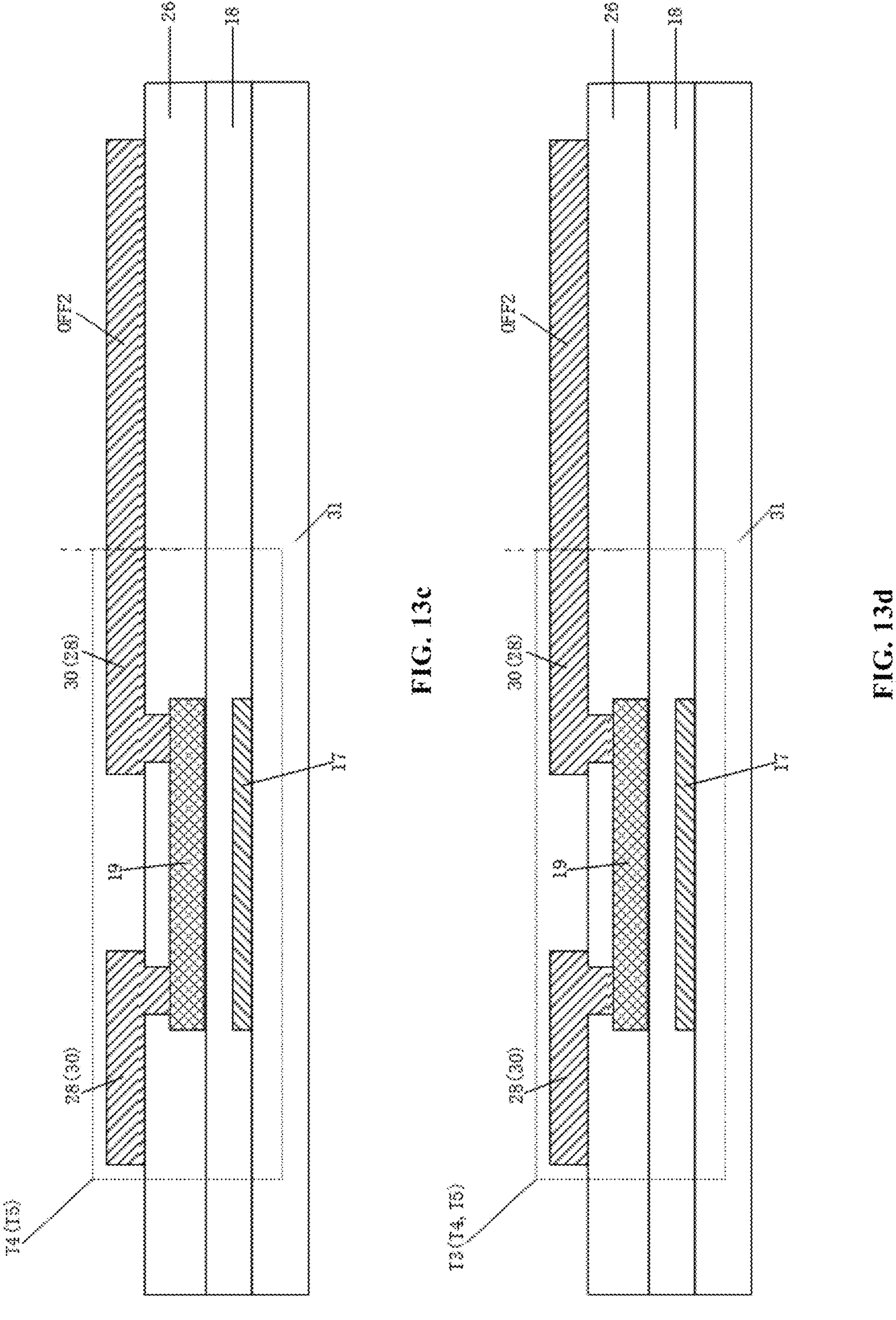
FIG. 13*c* is a cross-sectional view of a structure at a second anti-leakage node in a first shift register according to embodiments of the present disclosure.
FIG. 13*d* is a cross-sectional view of another structure at a second anti-leakage node in a first shift register according to embodiments of the present disclosure.

In some embodiments, FIG. 13*c* is a cross-sectional view of a structure at a second anti-leakage node in a first shift register according to embodiments of the present disclosure. Referring to FIGS. 12 and 13*c*, the second anti-leakage node OFF2 is disposed in the same layer as the first electrode 28 of the fourth transistor T4 and the second electrode 30 of the fifth transistor T5, the first electrode 28 and the second electrode 30 of the fourth transistor T4 and the first electrode 28 and the second electrode 30 of the fifth transistor T5 are disposed in the same layer; the control electrodes (i.e., the gate electrodes 17), the active layers 19 and the first electrodes 28 of the fourth transistor T4 and the fifth transistor T5 are sequentially disposed on the substrate 31.

In some embodiments, FIG. 13*d* is a cross-sectional view of another structure at a second anti-leakage node in a first shift register according to embodiments of the present disclosure. Referring to FIGS. 12 and 13*d*, the second anti-leakage node OFF2 is disposed in the same layer as the second electrode 30 of the third transistor T3, the first electrode 28 of the fourth transistor T4, and the second electrode 30 of the fifth transistor T5; the first electrode 28 and the second electrode 30 of the third transistor T3, the first electrode 28 and the second electrode 30 of the fourth transistor T4, and the first electrode 28 and the second electrode 30 of the fifth transistor T5 are disposed in the same layer; the control electrodes (i.e., the gate electrodes 17), the active layers 19, and the first electrodes 28 of the third transistor T3, the fourth transistor T4, and the fifth transistor T5 are sequentially disposed on the substrate 31.

Figure 14:
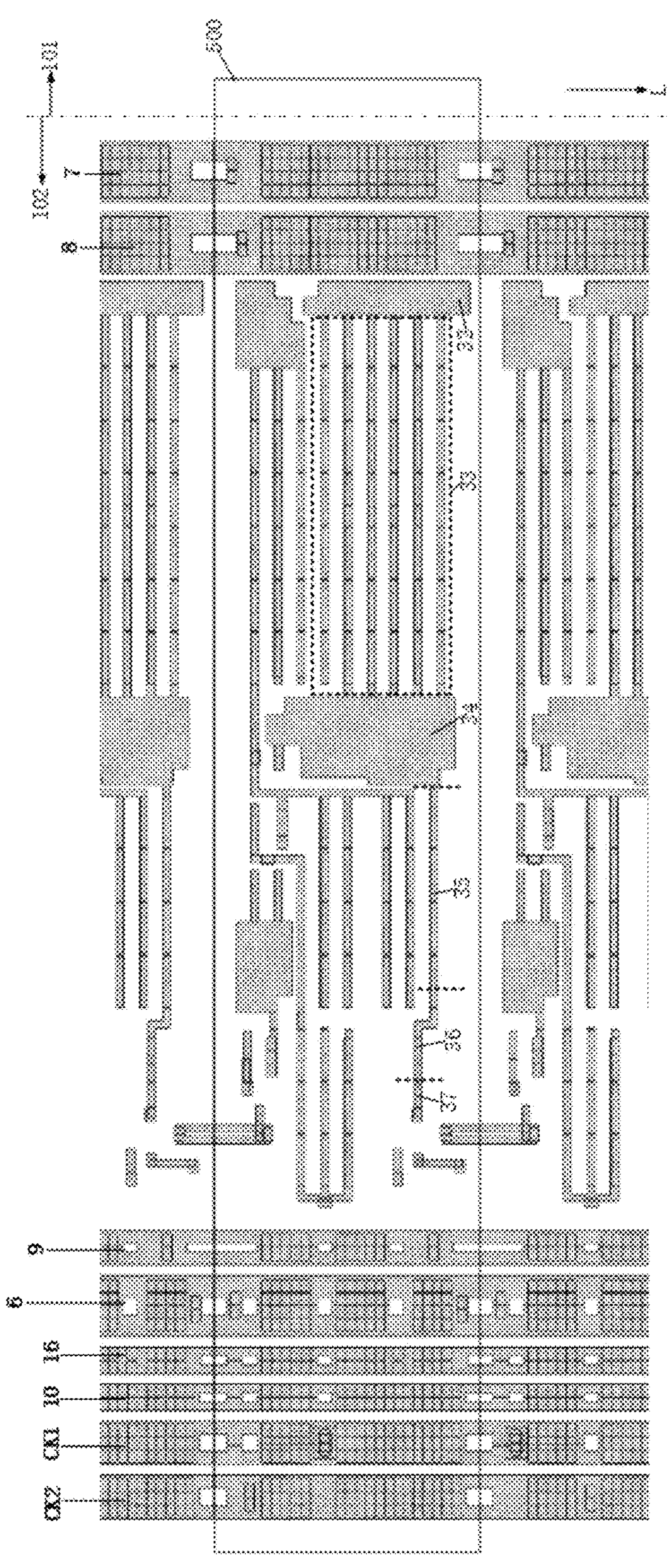
FIG. 14 is a layout of a layer where gates of transistors in a first shift register are located according to embodiments of the present disclosure.

In some embodiments, FIG. 14 is a layout of a layer where a gate of a transistor in a first shift register is located according to embodiments of the present disclosure. Referring to FIG. 14, the first plate 32 of the first capacitor, the control electrode 33 of the sixth transistor, the first plate 34 of the fourth capacitor, the control electrode 35 of the seventh transistor, the control electrode 36 of the fourteenth transistor, and the control electrode 37 of the fifth transistor in the first shift register 500 are located in the same layer, and are electrically connected to each other as a whole, and extend along a direction away from the display region 101.

Figure 15:
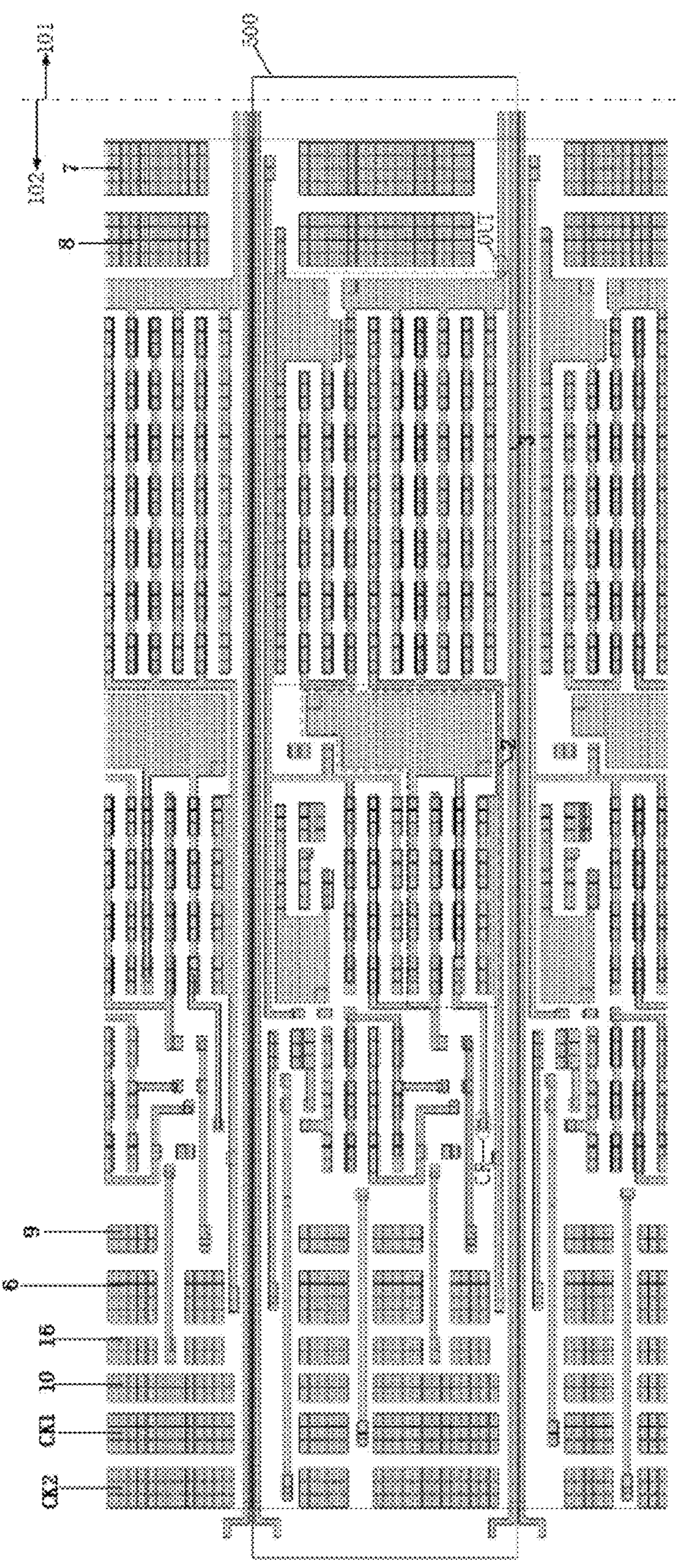
FIG. 15 is a layout of a layer where first electrodes and second electrodes of transistors in a first shift register are located according to embodiments of the present disclosure.

In some embodiments, referring to FIG. 15, FIG. 15 is a layout of a layer where a first electrode and a second electrode of a transistor in a first shift register are located according to embodiments of the present disclosure. Referring to FIG. 12 and FIG. 15, the light-emitting cascade signal output terminal CR in the first shift register 500 is located in a region between the fourth power signal line 9 and the light-emitting cascade output circuit 2; the light-emitting control driving signal output terminal OUT in the first shift register is located in a region between the light-emitting driving output circuit 3 and the third power signal line 8; the light-emitting cascade signal output terminal CR and the light-emitting control driving signal output terminal OUT are disposed in the same layer as the first and second electrodes 28 and 30 of the transistors in the first shift register 500.

In some embodiments, referring to FIGS. 12 and 14, the light-emitting cascade signal output terminal CR of the first shift register 500 at the previous stage and the light-emitting signal input terminal STU of the first shift register 500 at the next stage are electrically connected to each other by the first connection line 38; the first connection line 38 is provided in the same layer as the control electrodes (i.e., the gate electrodes 17) of the transistors.

In some embodiments, referring to FIGS. 12 and 14, the first clock signal line CK1, the second clock signal line CK2, the light-emitting signal input line 10, the light-emitting global reset signal line 16, the first power signal line 6, the fourth power signal line 9, the third power signal line 8, and the second power signal line 7 are parallel to each other and extend in the arrangement direction L of the plurality of first shift registers 500; the first connection line 38 extends in the arrangement direction L of the plurality of first shift registers 500.

According to the display apparatus provided by the embodiments of the present disclosure, by adopting the first gate driving circuit in the embodiment, the pixel unit in the display apparatus is more stably driven to emit light, so that the display stability of the display apparatus is ensured, and the display quality of the display apparatus is improved.

The display apparatus provided by the embodiments of the present disclosure may be: any product or component with a display function, such as a flexible wearable device, a mobile phone, a tablet computer, a television, a display, a notebook computer, a digital photo frame, a navigator or the like. Other essential components of the display apparatus are understood by one of ordinary skill in the art, and are not described herein or should not be construed as limiting the invention.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A shift register, comprising:

a voltage regulating circuit electrically connected to a light-emitting signal input terminal, a first clock signal terminal, a second clock signal terminal, a first node, and a second node, and configured to adjust voltages at the first node and the second node in response to control of signals provided by the light-emitting signal input terminal, the first clock signal terminal, and the second clock signal terminal;

a light-emitting cascade output circuit electrically connected to a first power terminal, a second power terminal, a light-emitting cascade signal output terminal, the first node, and the second node, and configured to write a second operating voltage provided by the second power terminal to the light-emitting cascade signal output terminal in response to control of the voltage at the first node, and write a first operating voltage provided by the first power terminal to the light-emitting cascade signal output terminal in response to control of the voltage at the second node;

a light-emitting driving output circuit electrically connected to a fifth power terminal, a third power terminal, a light-emitting control driving signal output terminal, the second node, the first node, and configured to write a third operating voltage provided by the third power terminal to the light-emitting control driving signal output terminal in response to control of the voltage at the first node, and to write a fifth operating voltage provided by the fifth power terminal to the light-emitting control driving signal output terminal in response to control of the voltage at the second node; and a first anti-leakage circuit electrically connected to the light-emitting cascade output circuit at a first anti-leakage node, and further electrically connected to the first node, the second node, the second power terminal, and a fourth power terminal, and configured to write a fourth operating voltage provided by the fourth power terminal to the first anti-leakage node in response to control of the voltage at the second node, wherein the first anti-leakage circuit comprises a thirteenth transistor and a fourteenth transistor, a control electrode of the thirteenth transistor is electrically connected to the first node, a first electrode of the thirteenth transistor is electrically connected to the second power terminal, and a second electrode of the thirteenth transistor is electrically connected to the first anti-leakage node and a second electrode of the fourteenth transistor; and a control electrode of the fourteenth transistor is electrically connected to the second node, and a first electrode of the fourteenth transistor is electrically connected to the fourth power terminal.

2. The shift register according to claim 1, wherein the light-emitting cascade output circuit comprises a seventh transistor and a twelfth transistor, a control electrode of the twelfth transistor is electrically connected to the first node, a first electrode of the twelfth transistor is electrically connected to the first anti-leakage node, and a second electrode of the twelfth transistor is electrically connected to the light-emitting cascade signal output terminal; and a control electrode of the seventh transistor is electrically connected to the second node, a first electrode of the seventh transistor is electrically connected to the light-emitting cascade signal output terminal, and a second electrode of the seventh transistor is electrically connected to the first power terminal; and wherein the light-emitting cascade output circuit further comprises a fourth capacitor, and a first terminal of the fourth capacitor is electrically connected to the light-emitting cascade signal output terminal, and a second terminal of the fourth capacitor is electrically connected to the second node.

3. The shift register according to claim 1, wherein the light-emitting driving output circuit comprises an eleventh transistor, a second capacitor, a first capacitor, and a sixth transistor;

a control electrode of the eleventh transistor is electrically connected to the first node, a first electrode of the eleventh transistor is electrically connected to the third power terminal, and a second electrode of the eleventh transistor is electrically connected to the light-emitting control driving signal output terminal;

a first terminal of the second capacitor is electrically connected to the third power terminal, and a second terminal of the second capacitor is electrically connected to the first node;

a control electrode of the sixth transistor is electrically connected to the second node, a first electrode of the sixth transistor is electrically connected to the light-emitting control driving signal output terminal, and a second electrode of the sixth transistor is electrically connected to the fifth power terminal; and a first terminal of the first capacitor is electrically connected to the light-emitting control driving signal output terminal, and a second terminal of the first capacitor is electrically connected to the second node.

4. The shift register according to claim 1, wherein the fourth operating voltage provided by the fourth power terminal is higher than the first operating voltage provided by the first power terminal.

5. The shift register according to claim 1, wherein the second operating voltage provided by the second power terminal is lower than the third operating voltage provided by the third power terminal.

6. A gate driving circuit, comprising: a plurality of cascaded first shift registers, each of which is the shift register according to claim 1;

the light-emitting signal input terminal of the first shift register at a first stage is electrically connected to a light-emitting start signal line, and the first shift registers at stages other than the first stage are electrically connected to light-emitting cascade signal output terminals of the first shift registers at respective previous stages; and the light-emitting control driving signal output terminals of the first shift registers are electrically connected to corresponding light-emitting control signal lines.

7. A display apparatus, comprising: a display region and a peripheral region at a periphery of the display region; wherein the display region comprises a plurality of pixel units arranged in an array therein, each row of pixel units are configured with a corresponding light-emitting control signal line electrically connected to control electrodes of light-emitting control transistors in corresponding pixel units; and the peripheral region comprises a first gate driving circuit, which is the gate driving circuit according to claim 6; and wherein the light-emitting driving output circuit, the light-emitting cascade output circuit, and the voltage regulating circuit of the first shift register in the first gate driving circuit are sequentially distributed in a direction away from the display region; and the first anti-leakage circuit of the first shift register is in a region between the light-emitting driving output circuit and the voltage regulating circuit.

8. The display apparatus according to claim 7, wherein the first power terminal is electrically connected to a first power signal line; the second power terminal is electrically connected to a second power signal line; the third power terminal is electrically connected to a third power signal line; the fourth power terminal is electrically connected to a fourth power signal line;

the first clock signal terminal is electrically connected to a first clock signal line;

the second clock signal terminal is electrically connected to a second clock signal line;

the light-emitting signal input terminal is electrically connected to a light-emitting signal input line; the light-emitting global reset signal terminal is electrically connected to a light-emitting global reset signal line;

the first clock signal line, the second clock signal line, the light-emitting signal input line, the light-emitting global reset signal line, the first power signal line and the fourth power signal line are on a side of the voltage regulating circuit away from the display region and are sequentially distributed in a direction close to the display region; and the third power signal line and the second power signal line are on a side of the light-emitting driving output circuit close to the display region and are sequentially distributed in a direction close to the display region.

9. The display apparatus according to claim 8, wherein the light-emitting cascade signal output terminal in the first shift register is in a region between the fourth power signal line and the light-emitting cascade output circuit;

the light-emitting control driving signal output terminal in the first shift register is in a region between the light-emitting driving output circuit and the third power signal line; and the light-emitting cascade signal output terminal and the light-emitting control driving signal output terminal are in a same layer as first electrodes and second electrodes of transistors in the first shift register.

10. The display apparatus according to claim 9, wherein the light-emitting cascade signal output terminal of the first shift register at a previous stage and the light-emitting signal input terminal of the first shift register at a next stage are electrically connected to each other by a first connection line; and the first connection line is in a same layer as the control electrodes of transistors; and wherein the first clock signal line, the second clock signal line, the light-emitting signal input line, the light-emitting global reset signal line, the first power signal line, the fourth power signal line, the third power signal line, and the second power signal line are parallel to each other and extend in a direction that the plurality of first shift registers are arranged; and the first connection line extends in the direction that the plurality of first shift registers are arranged.

11. The display apparatus according to claim 7, wherein the first anti-leakage circuit comprises a thirteenth transistor and a fourteenth transistor, a control electrode of the thirteenth transistor is electrically connected to the first node, a first electrode of the thirteenth transistor is electrically connected to the second power terminal, and a second electrode of the thirteenth transistor is electrically connected to the first anti-leakage node and a second electrode of the fourteenth transistor; and a control electrode of the fourteenth transistor is electrically connected to the second node, and a first electrode of the fourteenth transistor is electrically connected to the fourth power terminal;

the light-emitting cascade output circuit comprises a seventh transistor and a twelfth transistor, a control electrode of the twelfth transistor is electrically connected to the first node, a first electrode of the twelfth transistor is electrically connected to the first anti-leakage node, and a second electrode of the twelfth transistor is electrically connected to the light-emitting cascade signal output terminal; and a control electrode of the seventh transistor is electrically connected to the second node, a first electrode of the seventh transistor is electrically connected to the light-emitting cascade signal output terminal, and a second electrode of the seventh transistor is electrically connected to the first power terminal;

wherein the first anti-leakage node of the first shift register in the first gate driving circuit is in a same layer as the first electrode of the twelfth transistor, the second electrode of the thirteenth transistor, and the second electrode of the fourteenth transistor, the first anti-leakage node is arranged at a side of the first electrode of the twelfth transistor and the second electrode of the thirteenth transistor away from the display region to the second electrode of the fourteenth transistor, and extends in a direction away from the display region to be electrically connected to the second electrode of the fourteenth transistor;

the first electrodes and the second electrodes of the twelfth transistor, the thirteenth transistor and the fourteenth transistor are in a same layer; and the control electrodes, active layers and the first electrodes of the twelfth transistor, the thirteenth transistor and the fourteenth transistor are sequentially arranged on a substrate.

12. The display apparatus according to claim 7, further comprising a second anti-leakage circuit, the voltage regulating circuit is electrically connected to a fourth node, and the second anti-leakage circuit is between the fourth node and the second node; and the second anti-leakage circuit is further electrically connected to the first clock signal terminal and the fourth power terminal, and is configured to write the fourth operating voltage provided by the fourth power terminal to the fourth node under control of the voltage at the second node; and wherein the second anti-leakage circuit comprises a fourth transistor and a fifth transistor;

a control electrode of the fourth transistor is electrically connected to the first clock signal terminal, a first electrode of the fourth transistor is electrically connected to a second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node;

wherein the second anti-leakage node of the first shift register in the first gate driving circuit is in a same layer as the first electrode of the fourth transistor and the second electrode of the fifth transistor, the first electrodes and the second electrodes of the fourth transistor and the fifth transistor are in a same layer; and the control electrodes, active layers and the first electrodes of the fourth transistor and the fifth transistor are sequentially arranged on a substrate.

13. The display apparatus according to claim 7, further comprising a second anti-leakage circuit, the voltage regulating circuit is electrically connected to a fourth node, and the second anti-leakage circuit is between the fourth node and the second node; and the second anti-leakage circuit is further electrically connected to the first power terminal and the fourth power terminal, and is configured to write the fourth operating voltage provided by the fourth power terminal to a second anti-leakage node under control of the voltage at the second node, where the second anti-leakage node is between the second node and the fourth node; and wherein the second anti-leakage circuit comprises a third transistor, a fourth transistor, and a fifth transistor;

a control electrode of the third transistor is electrically connected to the first power terminal, a first electrode of the third transistor is electrically connected to the fourth node, and a second electrode of the third transistor is electrically connected to the second anti-leakage node;

a control electrode of the fourth transistor is electrically connected to the first power terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node, wherein the second anti-leakage node of the first shift register in the first gate driving circuit is in a same layer as the second electrode of the third transistor, the first electrode of the fourth transistor, and the second electrode of the fifth transistor, the first electrode and the second electrode of the third transistor, the first electrode and the second electrode of the fourth transistor, and the first electrode and the second electrode of the fifth transistor are in the same layer; and the control electrodes, active layers and the first electrodes of the third transistor, the fourth transistor and the fifth transistor are sequentially on a substrate.

14. A shift register, comprising:

a voltage regulating circuit electrically connected to a light-emitting signal input terminal, a first clock signal terminal, a second clock signal terminal, a first node, and a second node, and configured to adjust voltages at the first node and the second node in response to control of signals provided by the light-emitting signal input terminal, the first clock signal terminal, and the second clock signal terminal;

a light-emitting cascade output circuit electrically connected to a first power terminal, a second power terminal, a light-emitting cascade signal output terminal, the first node, and the second node, and configured to write a second operating voltage provided by the second power terminal to the light-emitting cascade signal output terminal in response to control of the voltage at the first node, and write a first operating voltage provided by the first power terminal to the light-emitting cascade signal output terminal in response to control of the voltage at the second node;

a light-emitting driving output circuit electrically connected to a fifth power terminal, a third power terminal, a light-emitting control driving signal output terminal, the second node, the first node, and configured to write a third operating voltage provided by the third power terminal to the light-emitting control driving signal output terminal in response to control of the voltage at the first node, and to write a fifth operating voltage provided by the fifth power terminal to the light-emitting control driving signal output terminal in response to control of the voltage at the second node; and a first anti-leakage circuit electrically connected to the light-emitting cascade output circuit at a first anti-leakage node, and further electrically connected to the first node, the second node, the second power terminal, and a fourth power terminal, and configured to write a fourth operating voltage provided by the fourth power terminal to the first anti-leakage node in response to control of the voltage at the second node, the shift register further comprises a second anti-leakage circuit, the voltage regulating circuit is electrically connected to a fourth node, and the second anti-leakage circuit is between the fourth node and the second node; and the second anti-leakage circuit is further electrically connected to the first power terminal and the fourth power terminal, and is configured to write the fourth operating voltage provided by the fourth power terminal to a second anti-leakage node under control of the voltage at the second node, where the second anti-leakage node is between the second node and the fourth node; and wherein the second anti-leakage circuit comprises a third transistor, a fourth transistor, and a fifth transistor;

a control electrode of the third transistor is electrically connected to the first power terminal, a first electrode of the third transistor is electrically connected to the fourth node, and a second electrode of the third transistor is electrically connected to the second anti-leakage node;

a control electrode of the fourth transistor is electrically connected to the first power terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node.

15. The shift register according to claim 14, wherein the voltage regulating circuit comprises: a light-emitting global reset circuit electrically connected to a light-emitting global reset signal terminal, the first power terminal, and the fourth node, and configured to write the first operating voltage provided by the first power terminal to the fourth node in response to control of a signal provided by the light-emitting global reset signal terminal; and wherein the light-emitting global reset circuit comprises a first transistor; and a control electrode of the first transistor is electrically connected to the light-emitting global reset signal terminal, a first electrode of the first transistor is electrically connected to the fourth node, and a second electrode of the first transistor is electrically connected to the first power terminal.

16. The shift register according to claim 14, wherein the voltage regulating circuit comprises:

a first input circuit electrically connected to the light-emitting signal input terminal, the first clock signal terminal, and the fourth node, and configured to write a signal provided by the light-emitting signal input terminal to the fourth node in response to control of a signal provided by the first clock signal terminal;

a second input circuit electrically connected to the light-emitting signal input terminal, the second clock signal terminal, the first power terminal, and a third node, and configured to write the first operating voltage provided by the first power terminal to the third node in response to control of a signal provided by the second clock signal terminal, and write a signal provided by the second clock signal terminal to the third node in response to control of a signal provided by the light-emitting signal input terminal;

a first voltage control circuit electrically connected to the first clock signal terminal, the second power terminal, the first node, the second node, and the third node, and configured to write a signal provided by the first clock signal terminal to the first node in response to control of a voltage at the third node and a signal provided by the first clock signal terminal, and write the second operating voltage provided by the second power terminal to the first node in response to control of the voltage at the second node; and a second voltage control circuit electrically connected to the first clock signal terminal, the third power terminal, the third node, and the fourth node, and configured to write the third operating voltage provided by the third power terminal to the fourth node in response to the voltage at the third node and a signal provided by the second clock signal terminal;

wherein the first input circuit comprises a second transistor; the second input circuit comprises an eighth transistor and a fifteenth transistor; the first voltage control circuit comprises a ninth transistor, a tenth transistor, an eighteenth transistor and a third capacitor; the second voltage control circuit comprises a sixteenth transistor and a seventeenth transistor;

a control electrode of the second transistor is electrically connected to the first clock signal terminal, a first electrode of the second transistor is electrically connected to the light-emitting signal input terminal, and a second electrode of the second transistor is electrically connected to the fourth node;

a control electrode of the eighth transistor is electrically connected to the second clock signal terminal, a first electrode of the eighth transistor is electrically connected to the first power terminal, and a second electrode of the eighth transistor is electrically connected to the third node;

a control electrode of the fifteenth transistor is electrically connected to the light-emitting signal input terminal, a first electrode of the fifteenth transistor is electrically connected to the third node, and a second electrode of the fifteenth transistor is electrically connected to the second clock signal terminal;

a control electrode of the ninth transistor is electrically connected to the third node, a first electrode of the ninth transistor is electrically connected to the first clock signal terminal, and a second electrode of the ninth transistor is electrically connected to a second terminal of the third capacitor;

a control electrode of the tenth transistor is electrically connected to the first clock signal terminal, a first electrode of the tenth transistor is electrically connected to the second terminal of the third capacitor, and a second electrode of the tenth transistor is electrically connected to the first node;

a control electrode of the eighteenth transistor is electrically connected to the second node, a first electrode of the eighteenth transistor is electrically connected to the first node, and a second electrode of the eighteenth transistor is electrically connected to the second power terminal;

a first terminal of the third capacitor is electrically connected to the third node;

a control electrode of the seventeenth transistor is electrically connected to the third node, a first electrode of the seventeenth transistor is electrically connected to the third power terminal, and a second electrode of the seventeenth transistor is electrically connected to a first electrode of the sixteenth transistor; and a control electrode of the sixteenth transistor is electrically connected to the first clock signal terminal, and a second electrode of the sixteenth transistor is electrically connected to the fourth node.

17. A shift register, comprising:

a voltage regulating circuit electrically connected to a light-emitting signal input terminal, a first clock signal terminal, a second clock signal terminal, a first node, and a second node, and configured to adjust voltages at the first node and the second node in response to control of signals provided by the light-emitting signal input terminal, the first clock signal terminal, and the second clock signal terminal;

a light-emitting cascade output circuit electrically connected to a first power terminal, a second power terminal, a light-emitting cascade signal output terminal, the first node, and the second node, and configured to write a second operating voltage provided by the second power terminal to the light-emitting cascade signal output terminal in response to control of the voltage at the first node, and write a first operating voltage provided by the first power terminal to the light-emitting cascade signal output terminal in response to control of the voltage at the second node;

a light-emitting driving output circuit electrically connected to a fifth power terminal, a third power terminal, a light-emitting control driving signal output terminal, the second node, the first node, and configured to write a third operating voltage provided by the third power terminal to the light-emitting control driving signal output terminal in response to control of the voltage at the first node, and to write a fifth operating voltage provided by the fifth power terminal to the light-emitting control driving signal output terminal in response to control of the voltage at the second node; and a first anti-leakage circuit electrically connected to the light-emitting cascade output circuit at a first anti-leakage node, and further electrically connected to the first node, the second node, the second power terminal, and a fourth power terminal, and configured to write a fourth operating voltage provided by the fourth power terminal to the first anti-leakage node in response to control of the voltage at the second node, the shift register further comprises a second anti-leakage circuit, the voltage regulating circuit is electrically connected to a fourth node, and the second anti-leakage circuit is between the fourth node and the second node; and the second anti-leakage circuit is further electrically connected to the first clock signal terminal and the fourth power terminal, and is configured to write the fourth operating voltage provided by the fourth power terminal to the fourth node under control of the voltage at the second node; and wherein the second anti-leakage circuit comprises a fourth transistor and a fifth transistor;

a control electrode of the fourth transistor is electrically connected to the first clock signal terminal, a first electrode of the fourth transistor is electrically connected to a second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node, or the second anti-leakage circuit comprises a third transistor, a fourth transistor, and a fifth transistor;

a control electrode of the third transistor is electrically connected to the first clock signal terminal, a first electrode of the third transistor is electrically connected to the fourth node, and a second electrode of the third transistor is electrically connected to a second anti-leakage node;

a control electrode of the fourth transistor is electrically connected to the first clock signal terminal, a first electrode of the fourth transistor is electrically connected to the second anti-leakage node, and a second electrode of the fourth transistor is electrically connected to the second node; and a control electrode of the fifth transistor is electrically connected to the second node, a first electrode of the fifth transistor is electrically connected to the fourth power terminal, and a second electrode of the fifth transistor is electrically connected to the second anti-leakage node.

18. The shift register according to claim 17, wherein the voltage regulating circuit comprises: a light-emitting global reset circuit electrically connected to a light-emitting global reset signal terminal, the first power terminal, and the second node, and configured to write the first operating voltage provided by the first power terminal to the second node in response to control of a signal provided by the light-emitting global reset signal terminal; and wherein the light-emitting global reset circuit comprises a first transistor; and a control electrode of the first transistor is electrically connected to the light-emitting global reset signal terminal, a first electrode of the first transistor is electrically connected to the second node, and a second electrode of the first transistor is electrically connected to the first power terminal.

* * * * *